US012666714B2

(12) United States Patent
Blin et al.

(10) Patent No.: US 12,666,714 B2
(45) Date of Patent: *Jun. 23, 2026

(54) METHODS RELATED TO RADIO-FREQUENCY SWITCHING DEVICES HAVING IMPROVED VOLTAGE HANDLING CAPABILITY

(71) Applicant: SKYWORKS SOLUTIONS, INC., Irvine, CA (US)

(72) Inventors: Guillaume Alexandre Blin, Carlisle, MA (US); Aniruddha B. Joshi, Irvine, CA (US); Christophe Masse, Andover, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/771,783

(22) Filed: Jul. 12, 2024

(65) Prior Publication Data

US 2025/0056880 A1 Feb. 13, 2025

Related U.S. Application Data

(63) Continuation of application No. 17/353,394, filed on Jun. 21, 2021, now Pat. No. 12,040,238, which is a
(Continued)

(51) Int. Cl.
*H10D 86/01* (2026.01)
*H03K 17/081* (2006.01)
(Continued)

(52) U.S. Cl.
CPC ....... *H10D 86/01* (2025.01); *H03K 17/08104* (2013.01); *H10D 30/6729* (2025.01);
(Continued)

(58) Field of Classification Search
CPC ..... H01L 21/84; H01L 23/66; H01L 27/1203; H01L 29/41733; H01L 23/3121;
(Continued)

(56) References Cited

U.S. PATENT DOCUMENTS 4,962,341 A * 10/1990 Schoeff ................. H03K 3/037
327/535
5,821,827 A * 10/1998 Mohwinkel .......... H03B 5/1852
331/177 V
(Continued)

FOREIGN PATENT DOCUMENTS

CN 1528056 A 9/2004
CN 1870433 A 11/2006
(Continued)

OTHER PUBLICATIONS

Baedi et al., The Effect of Gate Length on SOI-MOSFETs Operation, Advances in Applied Science Research, 2010, 1(1): pp. 14-18.
(Continued)

*Primary Examiner* — Maliheh Malek
(74) *Attorney, Agent, or Firm* — Chang & Hale LLP

(57) ABSTRACT

Methods related to radio-frequency (RF) switching devices having improved voltage handling capability. In some embodiments, a method for fabricating an RF switching device can include: providing a semiconductor substrate; forming a plurality of field-effect transistors (FETs) on the semiconductor substrate such that the FETs have a non-uniform distribution of a parameter; and connecting the FETs to form a stack, such that the non-uniform distribution results in the stack having a first voltage handling capacity that is greater than a second voltage handling capacity corresponding to a similar stack having a substantially uniform distribution of the parameter.

18 Claims, 14 Drawing Sheets

Related U.S. Application Data continuation of application No. 14/534,146, filed on Nov. 5, 2014, now Pat. No. 11,043,432.

(60) Provisional application No. 61/902,809, filed on Nov. 12, 2013, provisional application No. 61/902,808, filed on Nov. 12, 2013, provisional application No. 61/902,810, filed on Nov. 12, 2013.

(51) Int. Cl.

| | |
|---|---|
| *H10D 30/67* | (2025.01) |
| *H10D 84/01* | (2026.01) |
| *H10D 84/03* | (2025.01) |
| *H10D 84/85* | (2025.01) |
| *H10D 86/00* | (2025.01) |
| *H10W 44/20* | (2026.01) |
| *H10W 70/63* | (2026.01) |
| *H10W 72/50* | (2026.01) |
| *H10W 72/59* | (2026.01) |
| *H10W 72/90* | (2026.01) |
| *H10W 74/00* | (2026.01) |
| *H10W 74/10* | (2026.01) |
| *H10W 90/00* | (2026.01) |

(52) U.S. Cl.
CPC .......... *H10D 86/201* (2025.01); *H10W 44/20* (2026.01); *H10W 70/63* (2026.01); *H10D 84/0142* (2025.01); *H10D 84/038* (2025.01); *H10D 84/85* (2025.01); *H10W 72/551* (2026.01); *H10W 72/59* (2026.01); *H10W 72/932* (2026.01); *H10W 72/9445* (2026.01); *H10W 74/00* (2026.01); *H10W 74/114* (2026.01); *H10W 90/754* (2026.01)

(58) Field of Classification Search
CPC ....... H01L 24/06; H01L 24/48; H01L 27/092; H01L 2224/04042; H01L 2224/05554; H01L 2224/06135; H01L 2224/45099; H01L 2224/48091; H01L 2224/48227; H01L 2924/00014; H01L 2924/1306; H01L 2924/13091; H01L 2924/14215; H01L 2924/15192; H01L 2924/15313; H01L 2924/181; H01L 2924/19105; H01L 24/05; H01L 24/49; H01L 2224/49171; H01L 2924/15184; H01L 27/0207; H01L 21/823456; H01L 27/088; H01L 27/02; H01L 21/823821; H01L 21/823431; H01L 21/845; H01L 27/0886; H01L 27/0924; H01L 27/1211; H01L 27/10826; H01L 27/10879; H01L 2029/7858; H03K 17/08104; H03K 17/102; H03K 17/693; H01Q 11/12; G01R 23/00–20

See application file for complete search history.

(56) References Cited

U.S. PATENT DOCUMENTS

| | | | | |
|---|---|---|---|---|
| 6,049,080 A | | 4/2000 | Ito | |
| 6,501,136 B1 * | | 12/2002 | Lin | H10D 64/519 |
| | | | | 257/E29.136 |
| 6,642,578 B1 * | | 11/2003 | Arnold | H01P 1/15 |
| | | | | 257/341 |
| 6,750,517 B1 * | | 6/2004 | Ker | H10D 89/815 |
| | | | | 257/357 |
| 6,815,740 B2 * | | 11/2004 | Nelson | H10D 64/411 |
| | | | | 257/341 |
| 6,839,887 B1 * | | 1/2005 | Lampaer | G06F 30/36 |
| | | | | 716/112 |
| 6,909,189 B2 * | | 6/2005 | Nanjo | H01L 21/76895 |
| | | | | 257/E21.627 |
| 6,917,084 B2 * | | 7/2005 | Baum | H03F 3/3061 |
| | | | | 327/410 |
| 7,332,386 B2 * | | 2/2008 | Lee | H10P 30/204 |
| | | | | 257/E21.336 |
| 7,772,070 B2 * | | 8/2010 | Kitajima | H10D 89/10 |
| | | | | 438/587 |
| 7,934,173 B2 * | | 4/2011 | Shyu | G03F 1/36 |
| | | | | 430/5 |
| 8,022,745 B1 * | | 9/2011 | Dening | H03K 17/102 |
| | | | | 327/309 |
| 8,350,330 B2 * | | 1/2013 | Lu | B44F 1/045 |
| | | | | 257/E27.06 |
| 8,401,496 B2 * | | 3/2013 | Goto | H01P 1/213 |
| | | | | 455/26.1 |
| 8,418,120 B2 * | | 4/2013 | Lu | G06F 30/39 |
| | | | | 716/132 |
| 8,432,016 B1 * | | 4/2013 | Kerr | H10D 84/038 |
| | | | | 257/206 |
| 8,546,851 B2 * | | 10/2013 | Furuta | H10D 89/10 |
| | | | | 257/334 |
| 8,604,553 B2 * | | 12/2013 | Shinkawata | H10D 84/038 |
| | | | | 257/E21.632 |
| 8,716,786 B2 * | | 5/2014 | Baumgartner | H10D 30/0245 |
| | | | | 257/331 |
| 8,732,638 B1 * | | 5/2014 | Fa | G06F 30/398 |
| | | | | 716/106 |
| 8,816,388 B2 | | 8/2014 | Takada | |
| 8,896,034 B1 * | | 11/2014 | Vorhaus | H01L 23/4824 |
| | | | | 345/55 |
| 8,987,792 B2 * | | 3/2015 | Adamski | H10D 84/0179 |
| | | | | 257/E21.042 |
| 9,006,860 B2 * | | 4/2015 | Chuang | H10D 84/811 |
| | | | | 257/516 |
| 9,064,864 B1 * | | 6/2015 | Stessin | H01L 23/5286 |
| 9,087,173 B2 * | | 7/2015 | Tsai | G06F 30/398 |
| 9,136,263 B2 * | | 9/2015 | Koyama | H10D 64/519 |
| 9,349,655 B2 * | | 5/2016 | Diaz | H10D 84/0172 |
| 9,467,130 B2 * | | 10/2016 | Liu | H03K 5/14 |
| 9,594,862 B2 * | | 3/2017 | Lin | G03F 1/36 |
| 9,620,424 B2 * | | 4/2017 | Blin | H10D 86/01 |
| 9,721,936 B2 * | | 8/2017 | Zhu | H10D 89/10 |
| 9,806,094 B2 * | | 10/2017 | Whitefield | H10D 30/6729 |
| 9,837,324 B2 * | | 12/2017 | Blin | H10D 86/01 |
| 10,026,656 B2 * | | 7/2018 | Chuang | H10D 89/10 |
| 10,153,306 B2 * | | 12/2018 | Lee | H10D 86/01 |
| 10,229,902 B2 * | | 3/2019 | Zhu | H10D 89/10 |
| 10,580,705 B2 | | 3/2020 | Blin et al. | |
| 10,700,063 B2 * | | 6/2020 | Blin | H10D 84/83 |
| 11,043,432 B2 * | | 6/2021 | Blin | H10D 86/01 |
| 11,061,317 B2 * | | 7/2021 | Lin | G03F 1/36 |
| 11,133,272 B1 * | | 9/2021 | Kolev | H10D 89/10 |
| 11,854,607 B2 | | 12/2023 | Zhao et al. | |
| 2002/0030226 A1 * | | 3/2002 | Yasuhara | H10D 30/657 |
| | | | | 257/E29.054 |
| 2002/0040985 A1 * | | 4/2002 | Aldrich | H10D 84/907 |
| | | | | 257/202 |
| 2002/0088971 A1 * | | 7/2002 | Tezuka | H10D 86/201 |
| | | | | 257/19 |
| 2003/0085428 A1 * | | 5/2003 | Nelson | H10D 64/411 |
| | | | | 257/E29.127 |
| 2004/0110331 A1 * | | 6/2004 | Yeo | H10D 86/215 |
| | | | | 257/E21.442 |
| 2004/0238897 A1 * | | 12/2004 | Oishi | H10D 64/519 |
| | | | | 257/E29.136 |
| 2005/0009312 A1 * | | 1/2005 | Butt | H10D 84/0135 |
| | | | | 438/587 |
| 2005/0014473 A1 * | | 1/2005 | Zhao | H03K 17/693 |
| | | | | 455/83 |
| 2005/0051853 A1 * | | 3/2005 | Baum | H03F 3/3061 |
| | | | | 257/401 |
| 2005/0073366 A1 * | | 4/2005 | Jung | H03F 1/223 |
| | | | | 330/311 |
| 2005/0079721 A1 * | | 4/2005 | Buerger, Jr. | H10P 50/695 |
| | | | | 257/E27.005 |

(56)  References Cited

U.S. PATENT DOCUMENTS

| | | | | |
|---|---|---|---|---|
| 2005/0082620 A1* | 4/2005 | Cheng | H10D 62/151 | 257/365 |
| 2005/0151159 A1* | 7/2005 | Ma | H10D 62/126 | 257/163 |
| 2005/0216873 A1* | 9/2005 | Singh | G06F 30/33 | 716/112 |
| 2005/0270083 A1* | 12/2005 | Nakatsuka | H03F 3/195 | 257/E27.06 |
| 2006/0005624 A1 | 1/2006 | Hirano | | |
| 2006/0107246 A1* | 5/2006 | Nakamura | G06F 30/36 | 716/113 |
| 2007/0120153 A1* | 5/2007 | Williams | H10D 30/877 | 257/280 |
| 2007/0215952 A1* | 9/2007 | Ozawa | H10D 86/201 | 257/E21.639 |
| 2008/0149925 A1* | 6/2008 | Dusa | G03F 7/70658 | 257/E27.06 |
| 2008/0150022 A1* | 6/2008 | Pryor | H10D 64/519 | 257/341 |
| 2008/0157222 A1* | 7/2008 | Wang | H10D 84/83 | 257/E27.06 |
| 2008/0157226 A1* | 7/2008 | Majcherczak | H10D 64/257 | 257/401 |
| 2008/0174357 A1* | 7/2008 | Matsuda | H10D 64/519 | 327/427 |
| 2008/0230807 A1* | 9/2008 | Kuroda | H10D 10/821 | 257/713 |
| 2009/0072346 A1* | 3/2009 | Tomita | H01L 21/76229 | 257/E29.001 |
| 2009/0209074 A1* | 8/2009 | Anderson | H10D 30/6217 | 438/283 |
| 2009/0278569 A1* | 11/2009 | Taoka | H03K 19/094 | 430/30 |
| 2009/0309162 A1* | 12/2009 | Baumgartner | H10D 30/62 | 257/E25.01 |
| 2010/0096667 A1* | 4/2010 | Nakajima | H04B 1/48 | 257/256 |
| 2011/0001542 A1* | 1/2011 | Ranta | H03K 17/162 | 327/551 |
| 2011/0002080 A1* | 1/2011 | Ranta | H03K 17/162 | 361/277 |
| 2011/0029266 A1* | 2/2011 | Lee | G01R 31/2601 | 702/64 |
| 2011/0121362 A1 | 5/2011 | Braithwaite et al. | | |
| 2011/0294445 A1* | 12/2011 | Goto | H01P 1/15 | 455/83 |
| 2012/0012945 A1* | 1/2012 | Inoue | H10D 64/251 | 257/E27.06 |
| 2012/0112832 A1* | 5/2012 | Kawano | H03F 3/72 | 327/427 |
| 2012/0169423 A1* | 7/2012 | Kamiyama | H03F 3/211 | 330/277 |
| 2012/0197593 A1* | 8/2012 | Guo | G01R 31/2648 | 702/170 |
| 2012/0273747 A1* | 11/2012 | Saitoh | H10D 84/0158 | 257/E27.06 |
| 2012/0280280 A1* | 11/2012 | Zhang | H10D 64/411 | 257/E21.403 |
| 2012/0280713 A1* | 11/2012 | Katoh | H03K 3/356182 | 326/46 |
| 2013/0040434 A1* | 2/2013 | Tomita | H01L 21/76229 | 257/E21.409 |
| 2013/0061196 A1* | 3/2013 | Cheng | G06F 30/39 | 716/132 |
| 2013/0072134 A1* | 3/2013 | Goto | H04B 1/109 | 333/101 |
| 2013/0115895 A1* | 5/2013 | Crandall | H10D 62/127 | 455/73 |
| 2013/0134018 A1* | 5/2013 | Aimi | H01H 59/0009 | 200/181 |
| 2013/0134372 A1* | 5/2013 | Sakuma | H10B 43/35 | 438/514 |
| 2013/0193512 A1* | 8/2013 | Weis | H10D 62/106 | 257/E27.06 |
| 2013/0334610 A1* | 12/2013 | Moroz | H10D 84/853 | 257/E21.632 |
| 2014/0103434 A1* | 4/2014 | Lu | H10D 64/257 | 716/120 |
| 2014/0124867 A1* | 5/2014 | Kaibara | H01L 23/4824 | 257/368 |
| 2014/0131792 A1* | 5/2014 | Siemieniec | H10D 30/665 | 438/270 |
| 2014/0264625 A1* | 9/2014 | Adamski | H10D 84/0133 | 438/151 |
| 2014/0346601 A1* | 11/2014 | Sugiura | H10D 30/6729 | 257/347 |
| 2015/0041917 A1* | 2/2015 | Zhu | H10D 89/10 | 257/392 |
| 2015/0115354 A1* | 4/2015 | Kaindl | H10D 30/66 | 257/330 |
| 2015/0129965 A1* | 5/2015 | Roy | H10D 64/257 | 257/347 |
| 2015/0137260 A1* | 5/2015 | Matsui | H10D 84/83 | 257/390 |
| 2015/0140478 A1* | 5/2015 | Chen | G06F 30/398 | 716/55 |
| 2015/0171108 A1* | 6/2015 | Blin | H10D 86/01 | 257/390 |
| 2015/0171109 A1* | 6/2015 | Blin | H10D 86/01 | 257/390 |
| 2015/0171898 A1* | 6/2015 | Blin | H10D 86/01 | 257/390 |
| 2015/0279781 A1* | 10/2015 | Kaibara | H01L 23/4824 | 257/775 |
| 2016/0020173 A1* | 1/2016 | Wan | H10D 84/83 | 438/297 |
| 2017/0053938 A1* | 2/2017 | Whitefield | H10D 84/83138 | |
| 2017/0125533 A1* | 5/2017 | Kotani | H10D 64/411 | |
| 2017/0250200 A1* | 8/2017 | Lee | H10D 86/01 | |
| 2017/0263495 A1* | 9/2017 | Augendre | H10P 14/276 | |
| 2017/0346482 A1* | 11/2017 | Cebi | H10D 86/201 | |
| 2018/0047715 A1* | 2/2018 | Zhu | H10D 89/10 | |
| 2018/0144993 A1* | 5/2018 | Blin | H10D 86/01 | |
| 2019/0206863 A1* | 7/2019 | Blin | H10D 84/83 | |
| 2021/0357565 A1 | 11/2021 | Fang et al. | | |
| 2022/0013414 A1* | 1/2022 | Blin | H10D 86/01 | |
| 2022/0321119 A1 | 10/2022 | Lam | | |
| 2023/0260907 A1* | 8/2023 | Gupta | G05F 1/46 | 257/773 |
| 2025/0151392 A1* | 5/2025 | Blin | H10D 86/01 | |

FOREIGN PATENT DOCUMENTS

| | | | |
|---|---|---|---|
| CN | 101102103 A | 1/2008 | |
| CN | 102185594 A | 9/2011 | |
| CN | 102270982 A | 12/2011 | |
| EP | 0766396 A2 | 4/1997 | |

OTHER PUBLICATIONS

V. Srivastava et al., Effect of Gate Finger on Double-Gate MOSFET for RF Switch at 45-nm Technology, 2011 International Conference on Communication Systems and Network Technologies, 2011, IEEE Computer Society, 2011 International Conference, pp. 464-468.

CN 201410858446.8, Devices and Methods Related to Radio-Frequency Switches Having Improved Performance, Nov. 12, 2014.

CN 201911254831.0, Devices and Methods Related to Radio-Frequency Switches Having Improved Performance, Dec. 9, 2019.

EP 14192353.2, Devices and Methods Related to Radio-Frequency Switches Having Improved Performance, Nov. 7, 2014.

EP 19150840.7, Devices and Methods Related to Radio-Frequency Switches Having Improved Performance, Jan. 8, 2019.

U.S. Appl. No. 14/534,148, Devices and Methods Related to Radio-Frequency Switches Having Improved On-Resistance Performance, Nov. 5, 2014.

(56)  References Cited

OTHER PUBLICATIONS

U.S. Appl. No. 15/832,711, Devices and Methods Related to Radio-Frequency Switches Having Improved On-Resistance Performance, Dec. 5, 2017.

U.S. Appl. No. 14/534,149, Improved Linearity Performance for Radio-Frequency Switches, Nov. 5, 2014.

* cited by examiner

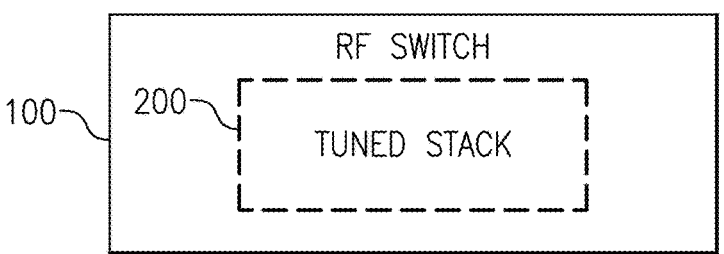
FIG.1
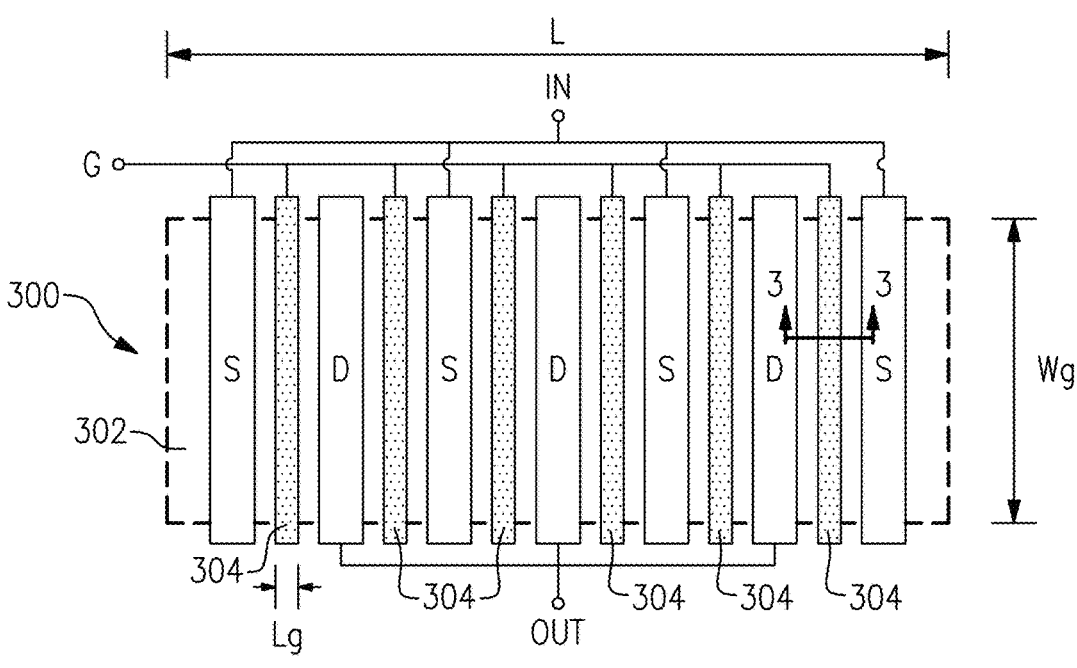
FIG.2
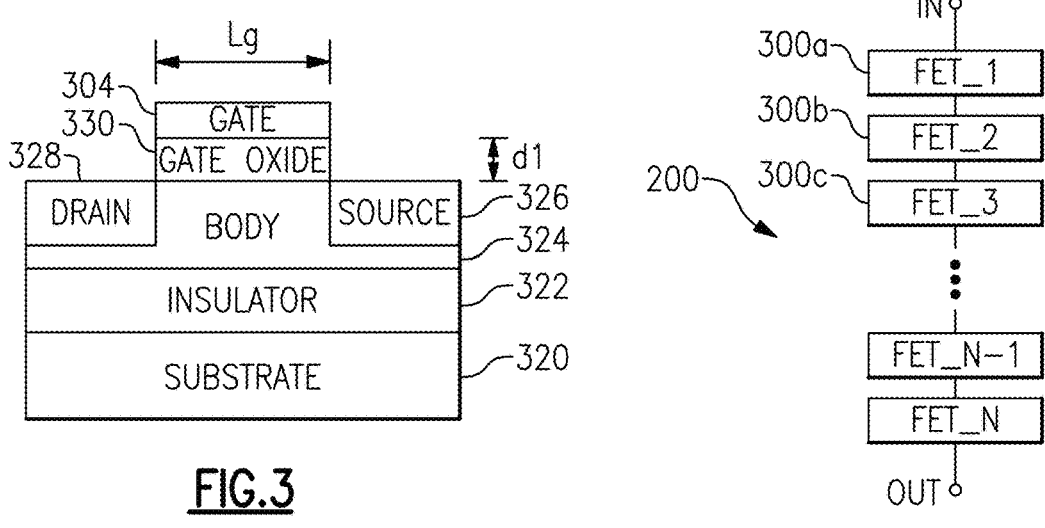
FIG.3
FIG.4

200

FET_1
FET_2

Wg1
Wg2

⋮

FET_34
FET_35

SINGLE-POLE SINGLE-THROW(SPST) SWITCH

102a

100

104a

RF CORE

104b

110

112

ENERGY MANAGEMENT (EM) CORE

FINGER-BASED P-CHANNEL          FINGER-BASED N-CHANNEL
SOI MOSFET TOP-VIEW              SOI MOSFET TOP-VIEW

FINGER-BASED P-CHANNEL          FINGER-BASED N-CHANNEL
SOI MOSFET TOP-VIEW              SOI MOSFET TOP-VIEW

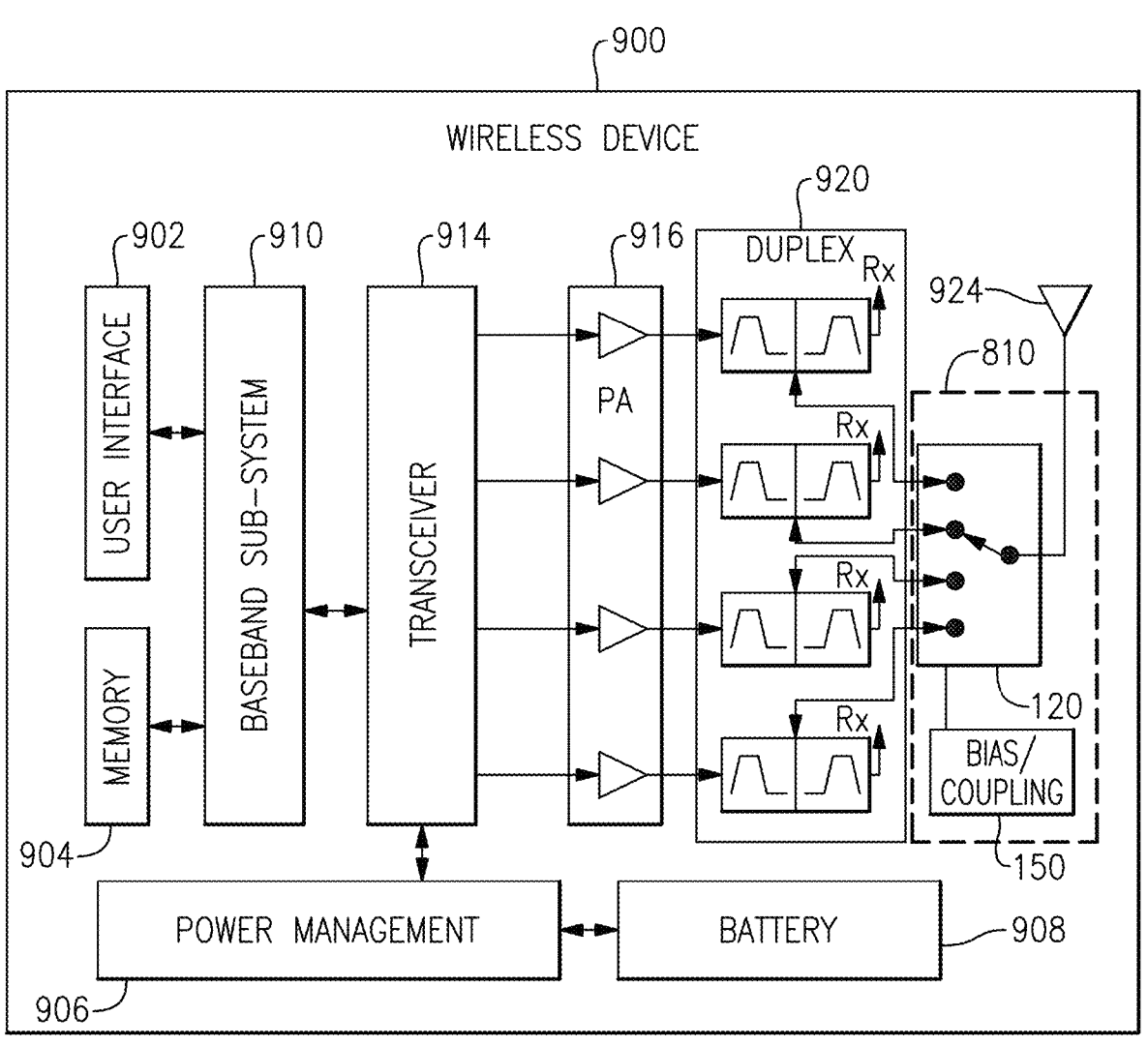
<u>FIG.26</u>

METHODS RELATED TO RADIO-FREQUENCY SWITCHING DEVICES HAVING IMPROVED VOLTAGE HANDLING CAPABILITY

CROSS-REFERENCE TO RELATED APPLICATION(S)

This application is a continuation of U.S. patent application Ser. No. 17/353,394, filed Jun. 21, 2021, entitled "RADIO-FREQUENCY SWITCHING DEVICES HAVING IMPROVED VOLTAGE HANDLING CAPABILITY," which is a continuation of U.S. patent application Ser. No. 14/534,146, filed Nov. 5, 2014, entitled "RADIO-FREQUENCY SWITCHING DEVICES HAVING IMPROVED VOLTAGE HANDLING CAPABILITY," now U.S. Pat. No. 11,043,432, issued Jun. 22, 2021, which claims priority to U.S. Provisional Application No. 61/902,808, filed Nov. 12, 2013, entitled "RADIO-FREQUENCY DEVICES HAVING IMPROVED VOLTAGE HANDLING CAPABILITY," U.S. Provisional Application No. 61/902, 809, filed Nov. 12, 2013, entitled "RADIO-FREQUENCY DEVICES HAVING IMPROVED ON-RESISTANCE PERFORMANCE," and U.S. Provisional Application No. 61/902,810, filed Nov. 12, 2013, entitled "RADIO-FREQUENCY DEVICES HAVING IMPROVED LINEARITY PERFORMANCE," the disclosure of each of which is hereby expressly incorporated by reference herein in its entirety.

BACKGROUND

Field

The present disclosure generally relates to improved radio-frequency switching devices.

Description of the Related Art

In some radio-frequency (RF) applications, switches are commonly arranged in a stack configuration to facilitate appropriate handling of power. For example, a higher stack height can be utilized to allow an RF switch to withstand higher power.

SUMMARY

According to some implementations, the present disclosure relates to a switching device that includes a first terminal and a second terminal. The switching device further includes a plurality of switching elements connected in series to form a stack between the first terminal and the second terminal. The switching elements have a non-uniform distribution of a parameter. The non-uniform distribution results in the stack having a first voltage handling capacity that is greater than a second voltage handling capacity corresponding to a similar stack having a substantially uniform distribution of the parameter.

In some embodiments, the stack can further have a first ON-resistance (Ron) value that is less than a second Ron value corresponding to the similar stack. In some embodiments, the stack can further have a first linearity performance that is better than a second linearity performance corresponding to the similar stack.

In some embodiments, each of the plurality of switching elements can include a field-effect transistor (FET) having a source, a drain and a gate formed on the active region. The FET can be implemented as a silicon-on-insulator (SOI) device.

In some embodiments, the parameter can include a length of the gate. The FET can be implemented as a finger configuration device such that the gate includes a number of rectangular shaped gate fingers, with each gate finger being implemented between a rectangular shaped source finger of the source contact and a rectangular shaped drain finger of the drain contact.

In some embodiments, the non-uniform distribution of the gate length can be based on a non-uniform distribution of another parameter associated with the FETs. The non-uniform distribution of the gate length can generally track the non-uniform distribution of the other parameter.

In some embodiments, the other parameter can include a distribution of voltage VDS across each FET. The non-uniform distribution of the gate length can be selected to yield a scaled version of the voltage VDS distribution. The scaled version of the voltage VDS distribution can be based on scaling of the highest value of a voltage VDS distribution corresponding to a substantially uniform distribution of the gate length. The highest value of the voltage VDS can be for the first FET from the first terminal. The first terminal can be configured as an input terminal for receiving a radio-frequency (RF) signal.

In some embodiments, the gate length of at least the first FET can be greater than the value of the uniform distribution of the gate length. At least some of the FETs can have gate lengths that are less than the value of the uniform distribution of the gate length.

In some embodiments, the sum of the VDS values of the FETs for the non-uniform distribution of the gate length can be greater than the sum of the VDS values of the FETs for the uniform distribution of the gate length. The sum of the gate lengths of the FETs for the non-uniform distribution of the gate length can be greater than the sum of the gate length of the FETs for the uniform distribution of the gate length.

In some embodiments, the non-uniform distribution of the gate length can include a plurality of groups of gate length values, with each group having a common value of the gate length.

In some embodiments, at least some of the FETs can include different values of gate widths. In some embodiments, the first terminal can be an input terminal and the second terminal can be an output terminal. In some embodiments, the switching device can be a radio-frequency (RF) switching device.

In a number of implementations, the present disclosure relates to a semiconductor die that includes a semiconductor substrate and a plurality of field-effect transistors (FETs) connected in series to form a stack. The FETs have a non-uniform distribution of a parameter. The non-uniform distribution results in the stack having a first voltage handling capacity that is greater than a second voltage handling capacity corresponding to a similar stack having a substantially uniform distribution of the parameter.

In accordance with a number of teachings, the present disclosure relates to a method for fabricating a radio-frequency (RF) switching device. The method includes providing a semiconductor substrate and forming a plurality of field-effect transistors (FETs) on the semiconductor substrate such that the FETs have a non-uniform distribution of a parameter. The method further includes connecting the FETs to form a stack, such that the non-uniform distribution results in the stack having a first voltage handling capacity that is greater than a second voltage handling capacity corresponding to a similar stack having a substantially uniform distribution of the parameter.

In some implementations, the present disclosure relates to a radio-frequency (RF) switching module that includes a packaging substrate configured to receive a plurality of components. The RF switching module further includes a die mounted on the packaging substrate. The die includes a switching circuit. The switching circuit includes a plurality of field-effect transistors (FETs) connected in series to form a stack. The FETs have a non-uniform distribution of a parameter. The non-uniform distribution results in the stack having a first voltage handling capacity that is greater than a second voltage handling capacity corresponding to a similar stack having a substantially uniform distribution of the parameter.

According to some implementations, the present disclosure relates to a wireless device that includes a transmitter and a power amplifier in communication with the transmitter. The power amplifier is configured to amplify a radio-frequency (RF) signal generated by the transmitter. The wireless device further includes an antenna configured to transmit the amplified RF signal. The wireless device further includes a switching circuit configured to route the amplified RF signal from the power amplifier to the antenna. The switching circuit includes a plurality of field-effect transistors (FETs) connected in series to form a stack. The FETs have a non-uniform distribution of a parameter. The non-uniform distribution results in the stack having a first voltage handling capacity that is greater than a second voltage handling capacity corresponding to a similar stack having a substantially uniform distribution of the parameter.

In a number of implementations, the present disclosure relates to a switching device that includes a first terminal and a second terminal, and a plurality of switching elements connected in series to form a stack between the first terminal and the second terminal. The switching elements has a non-uniform distribution of a parameter. The non-uniform distribution results in the stack having a first ON-resistance (Ron) value that is less than a second Ron value corresponding to a similar stack having a substantially uniform distribution of the parameter.

In some embodiments, the stack can further have a first voltage handling capacity that is at least as high as a second voltage handling capacity corresponding to the similar stack. In some embodiments, the stack can further have a first linearity performance that is better than a second linearity performance corresponding to the similar stack.

In some embodiments, each of the plurality of switching elements can include a field-effect transistor (FET) having a source, a drain and a gate formed on the active region. The FET can be implemented as a silicon-on-insulator (SOI) device.

In some embodiments, the parameter can include a length of the gate. The FET can be implemented as a finger configuration device such that the gate includes a number of rectangular shaped gate fingers, with each gate finger being implemented between a rectangular shaped source finger of the source contact and a rectangular shaped drain finger of the drain contact.

In some embodiments, the non-uniform distribution of the gate length can be based on a non-uniform distribution of another parameter associated with the FETs. The non-uniform distribution of the gate length can generally track the non-uniform distribution of the other parameter.

In some embodiments, the other parameter can include a distribution of voltage VDS across each FET. The non-uniform distribution of the gate length can be selected to yield a scaled version of the voltage VDS distribution. The scaled version of the voltage VDS distribution can be based on scaling of the highest value of a voltage VDS distribution corresponding to a substantially uniform distribution of the gate length. The highest value of the voltage VDS can be for the first FET from the first terminal. The first terminal can be configured as an input terminal for receiving a radio-frequency (RF) signal.

In some embodiments, the gate length of at least the first FET can be greater than the value of the uniform distribution of the gate length. At least some of the FETs can have gate lengths that are less than the value of the uniform distribution of the gate length.

In some embodiments, the sum of the VDS values of the FETs for the non-uniform distribution of the gate length can be greater than the sum of the VDS values of the FETs for the uniform distribution of the gate length. The sum of the gate lengths of the FETs for the non-uniform distribution of the gate length can be greater than the sum of the gate length of the FETs for the uniform distribution of the gate length.

In some embodiments, the non-uniform distribution of the gate length can include a plurality of groups of gate length values, with each group having a common value of the gate length.

In some embodiments, at least some of the FETs can include different values of gate widths. In some embodiments, the first terminal can be an input terminal and the second terminal can be an output terminal. In some embodiments, the switching device can be a radio-frequency (RF) switching device.

According to some teachings, the present disclosure relates to a semiconductor die that includes a semiconductor substrate and a plurality of field-effect transistors (FETs) connected in series to form a stack. The FETs have a non-uniform distribution of a parameter. The non-uniform distribution results in the stack having a first ON-resistance (Ron) value that is less than a second Ron value corresponding to a similar stack having a substantially uniform distribution of the parameter.

In some implementations, the present disclosure relates to a method for fabricating a radio-frequency (RF) switching device. The method includes providing a semiconductor substrate and forming a plurality of field-effect transistors (FETs) on the semiconductor substrate such that the FETs have a non-uniform distribution of a parameter. The method further includes connecting the FETs to form a stack, such that the non-uniform distribution results in the stack having a first ON-resistance (Ron) value that is greater than a second Ron corresponding to a similar stack having a substantially uniform distribution of the parameter.

In accordance with a number of implementations, the present disclosure relates to a radio-frequency (RF) switching module that includes a packaging substrate configured to receive a plurality of components, and a die mounted on the packaging substrate. The die has a switching circuit that includes a plurality of field-effect transistors (FETs) connected in series to form a stack. The FETs have a non-uniform distribution of a parameter. The non-uniform distribution results in the stack having a first ON-resistance (Ron) value that is less than a second Ron value corresponding to a similar stack having a substantially uniform distribution of the parameter.

In some teachings, the present disclosure relates to a wireless device that includes a transmitter and a power amplifier in communication with the transmitter. The power amplifier is configured to amplify a radio-frequency (RF) signal generated by the transmitter. The wireless device further includes an antenna configured to transmit the amplified RF signal, and a switching circuit configured to route the amplified RF signal from the power amplifier to the antenna. The switching circuit includes a plurality of field-effect transistors (FETs) connected in series to form a stack. The FETs have a non-uniform distribution of a parameter. The non-uniform distribution results in the stack having a first ON-resistance (Ron) value that is less than a second Ron value corresponding to a similar stack having a substantially uniform distribution of the parameter.

According to some implementations, the present disclosure relates to a switching device that includes a first terminal and a second terminal, and a plurality of switching elements connected in series to form a stack between the first terminal and the second terminal. The switching elements have a non-uniform distribution of a parameter. The non-uniform distribution results in the stack having a first linearity performance that is better than a second linearity performance corresponding to a similar stack having a substantially uniform distribution of the parameter.

In some embodiments, the stack can further have a first voltage handling capacity that is at least as high as a second voltage handling capacity corresponding to the similar stack. In some embodiments, the stack can further have a first ON-resistance (Ron) value that is less than a second Ron value corresponding to the similar stack.

In some embodiments, each of the plurality of switching elements can include a field-effect transistor (FET) having a source, a drain and a gate formed on the active region. The FET can be implemented as a silicon-on-insulator (SOI) device.

In some embodiments, the parameter can include an area of the gate.

In some embodiments, the parameter can include a length of the gate. The FET can be implemented as a finger configuration device such that the gate includes a number of rectangular shaped gate fingers, with each gate finger being implemented between a rectangular shaped source finger of the source contact and a rectangular shaped drain finger of the drain contact.

In some embodiments, the non-uniform distribution of the gate length can be based on a non-uniform distribution of another parameter associated with the FETs. The non-uniform distribution of the gate length can generally track the non-uniform distribution of the other parameter.

In some embodiments, the other parameter can include a distribution of voltage VDS across each FET. The non-uniform distribution of the gate length can be selected to yield a scaled version of the voltage VDS distribution. The scaled version of the voltage VDS distribution can be based on scaling of the highest value of a voltage VDS distribution corresponding to a substantially uniform distribution of the gate length. The highest value of the voltage VDS can be for the first FET from the first terminal. The first terminal can be configured as an input terminal for receiving a radio-frequency (RF) signal.

In some embodiments, the gate length of at least the first FET can be greater than the value of the uniform distribution of the gate length. At least some of the FETs can have gate lengths that are less than the value of the uniform distribution of the gate length.

In some embodiments, the sum of the VDS values of the FETs for the non-uniform distribution of the gate length can be greater than the sum of the VDS values of the FETs for the uniform distribution of the gate length. The sum of the gate lengths of the FETs for the non-uniform distribution of the gate length can be greater than the sum of the gate length of the FETs for the uniform distribution of the gate length.

In some embodiments, the non-uniform distribution of the gate length can include a plurality of groups of gate length values, with each group having a common value of the gate length.

In some embodiments, the first linearity performance can include a first ON-resistance (Ron) value that is less than a second Ron value corresponding to the second linearity performance. The distribution of VDS can be a non-uniform distribution to provide voltage handling capacity of the FETs as needed while maintaining the first Ron value less than the second Ron value.

In some embodiments, at least some of the FETs can include different values of gate widths. In some embodiments, the first terminal can be an input terminal and the second terminal can be an output terminal. In some embodiments, the switching device can be a radio-frequency (RF) switching device.

According to a number of teachings, the present disclosure relates to a semiconductor die having a semiconductor substrate and a plurality of field-effect transistors (FETs) connected in series to form a stack. The FETs have a non-uniform distribution of a parameter. The non-uniform distribution results in the stack having a first linearity performance that is better than a second linearity performance corresponding to a similar stack having a substantially uniform distribution of the parameter.

In some teachings, the present disclosure relates to a method for fabricating a radio-frequency (RF) switching device. The method includes providing a semiconductor substrate and forming a plurality of field-effect transistors (FETs) on the semiconductor substrate such that the FETs have a non-uniform distribution of a parameter. The method further includes connecting the FETs to form a stack, such that the non-uniform distribution results in the stack having a first linearity performance that is better than a second linearity performance corresponding to a similar stack having a substantially uniform distribution of the parameter.

In a number of implementations, the present disclosure relates to a radio-frequency (RF) switching module that includes a packaging substrate configured to receive a plurality of components, and a die mounted on the packaging substrate. The die has a switching circuit that includes a plurality of field-effect transistors (FETs) connected in series to form a stack. The FETs have a non-uniform distribution of a parameter. The non-uniform distribution results in the stack having a first linearity performance that is better than a second linearity performance corresponding to a similar stack having a substantially uniform distribution of the parameter.

According to some implementations, the present disclosure relates to a wireless device having a transmitter and a power amplifier in communication with the transmitter. The power amplifier is configured to amplify a radio-frequency (RF) signal generated by the transmitter. The wireless device further includes an antenna configured to transmit the amplified RF signal, and a switching circuit configured to route the amplified RF signal from the power amplifier to the antenna. The switching circuit includes a plurality of field-effect transistors (FETs) connected in series to form a stack. The FETs have a non-uniform distribution of a parameter. The non-uniform distribution results in the stack having a first linearity performance that is better than a second linearity performance corresponding to a similar stack having a substantially uniform distribution of the parameter For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 14/534,148, filed Nov. 5, 2014, titled "DEVICES AND METHODS RELATED TO RADIO-FREQUENCY SWITCHES HAVING IMPROVED ON-RESISTANCE PERFORMANCE," and U.S. patent application Ser. No. 14/534,149, filed Nov. 5, 2014, titled "IMPROVED LINEARITY PERFORMANCE FOR RADIO-FREQUENCY SWITCHES," each hereby incorporated by reference herein in its entirety.

BRIEF DESCRIPTION OF THE DRAWINGS

FIG. 1 shows a radio-frequency (RF) switch having a tuned stack.

FIG. 2 shows that in some embodiments, switching transistors such as FETs for the stack of FIG. 1 can be implemented in a finger configuration.

FIG. 3 shows an example side sectional view of a portion indicated in FIG. 2.

FIG. 4 depicts a stack having a plurality of individual FETs.

FIG. 26 depicts an example wireless device having one or more advantageous features described herein.

DETAILED DESCRIPTION OF SOME EMBODIMENTS

Figure 5A:
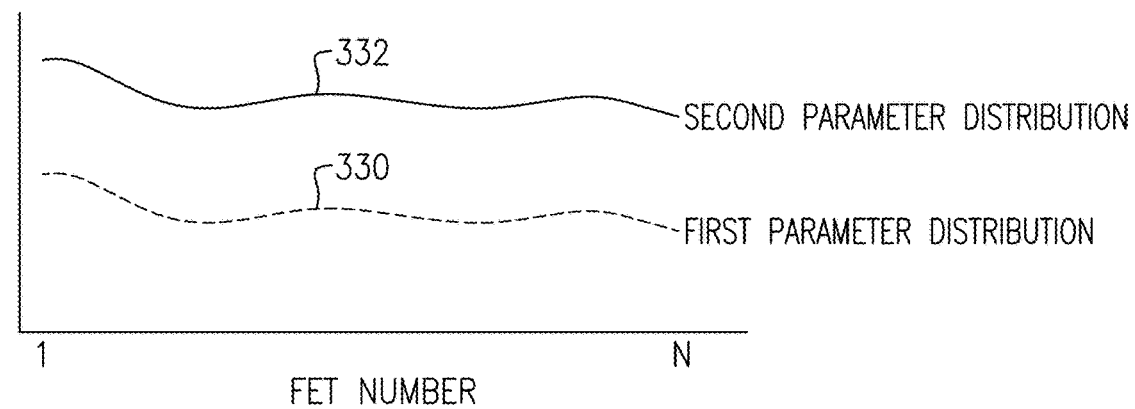
FIG. 5A shows that in some embodiments, a stack of FETs can be implemented with the FETs having a non-uniform distribution of a FET parameter, and where a first parameter distribution can generally track a second parameter distribution.

The headings provided herein, if any, are for convenience only and do not necessarily affect the scope or meaning of the claimed invention.

In antenna tuning or some other radio-frequency (RF) switching applications, a plurality of switching elements (e.g., field-effect transistors (FET)) can be used as passive components. They are commonly arranged in a stack configuration to facilitate appropriate handling of power. For example, a higher FET stack height can be utilized to allow an RF switch to withstand high power under mismatch.

In some applications, RF switches can be subjected to high peak RF voltages that are much higher than the voltage handling capability of a single FET. For example, RF switches handling GSM power commonly need to be designed to handle 25 Vpk while using FETs, with an individual handling voltage of, for example, 1.5V for 0.18 μm on silicon-on-insulator (SOI) device, and 5 Vpk for a gallium arsenide (GaAs) pseudomorphic high-electron-mobility transistor (pHEMT) device.

FET stacking configurations are commonly utilized (e.g., stack of individual FETs, multi-gate devices, or some combination thereof) to increase the voltage handling capability. In an ideal environment, the total voltage handling of a stack of such FETs should be equal to the sum of the individual handling voltages. However, parasitic effects (e.g., capacitive and/or resistive) relative to ground, between FETs of the stack, and/or respect to any other node associated with the stack circuit (such as a bias circuitry) can reduce the effective voltage handling capability by shunting some energy away from the stack of FETs.

For example, applications with higher voltage handling designs such as on-antenna tuning (e.g., aperture tuning), impedance matching, or higher power applications associated with base-stations, peak voltages can be as high as, for example, 100V to 200V. These designs typically utilize the stacking of a much higher number of devices, and the parasitic effects can become predominant, thereby limiting the maximum achievable voltage handling capability.

In the context of the foregoing higher voltage applications, more FETs can be arranged in series to meet the voltage handling requirements when the FETs are in an OFF state. Such an increase in the number of FETs may not be ideal in some situations. For example, degradation in ON-resistance (Ron) performance can occur when the FETs are in an ON state. It is noted that the total ON-resistance (Ron_total) of the stack is approximately equal to the stack height (stack_height) times the ON-resistance of a single FET (Ron_single_FET), assuming that all FETs have the same value of Ron_single_FET. For the voltage handling capability, the total voltage handling capacity (Vhandling) of the stack is typically much less than the product of the stack height (stack_height) and the voltage handling capacity of a single FET (Vhandling_single_FET). Thus, in some situations, Ron can degrade faster than the voltage handling improvement.

In the foregoing higher voltage applications where higher numbers of FETs are utilized, some FETs can be subjected to more voltages across them than necessary; and such devices can be further optimized in term of linearity (e.g., harmonics and intermodulation (e.g., IMD2, IMD3, IMD5, IP2, IP3)).

As described herein, one or more features of the present disclosure can provide, among others, improvements in the voltage handling capability of a given stack. In some embodiments, one or more of such advantageous features can be implemented in a simple stack of FETs, or a stack that utilizes other techniques for voltage imbalance compensation. In some embodiments, one or more of such advantageous features can also be implemented to yield or along with linearity improvement, and/or other biasing configurations for improving RF characteristics. Examples associated with such improvements in voltage handling performance are described herein in greater detail.

Also as described herein, one or more features of the present disclosure can allow reduction of the total Ron while maintaining the same or desirable voltage handling capability of the stack. In some embodiments, one or more of such advantageous features can be implemented in a simple stack of FETs, or a stack utilizes other techniques for voltage imbalance compensation. In some embodiments, one or more of such advantageous features can also be implemented to yield or along with linearity improvement, and/or other biasing configurations for improving RF characteristics. Examples associated with such improvements in Ron performance are described herein in greater detail.

As also described herein, one or more features of the present disclosure can allow further improvement in the linearity performance of the OFF stack by, for example, using more linear devices (e.g., typically shorter gate length) in parts of the stack where they can safely be used when in the OFF state. In some situations, the use of shorter gate length to improve linearity of the OFF stack can also improve the linearity of the ON stack by reducing the stack's overall Ron. For example, if the value of Ron increases in an RF system, the voltage developing across the ON stack can increase along with the harmonics and other linearity-degrading effects. A more compact area resulting from the use of a shorter gate length can reduce the coupling of the FET with the substrate and thus reduce non-linearity effects induced by the substrate. Further, such a reduction in area can allow use of a smaller die, thereby providing benefits associated with reduced cost and die size without sacrificing RF performance. Examples associated with such selective use of gate lengths to achieve further improvements in linearity performance are described herein in greater detail.

Described herein are devices and methods that can be implemented to address, among others, some or all of the foregoing examples of challenges and solutions associated with FET stacks. Although described in the context of FET stacks, it will be understood that one or more features of the present disclosure can also be implemented in switching stacks that utilize other types of switching elements. For example, switching or other type of stacks having diodes or microelectromechanical systems (MEMS) devices (e.g., MEMS capacitors or MEMS switches) as elements can also benefit from implementation of one or more features as described herein.

FIG. 1 schematically shows an RF switch 100 having a tuned stack 200. In some embodiments, such a tuned stack can be implemented by some or all of the FETs in the stack having different values of a parameter selected to achieve a desired functionality for the stack. Such a desired functionality can include some or all of the three examples described herein—improved voltage handling capability of a given stack, improved Ron performance, and improved linearity performance.

In some embodiments, the foregoing parameter having different values in a stack can include, for example, a dimension or a physical property associated with a part of a FET. In some embodiments, such a part associated with the FET can include a part that is inherent to the FET itself. In such embodiments, one can see that advantageous features provided by such tuning based on inherent part(s) of the FETs can be beneficial, since additional external components are not necessarily needed.

For the purpose of description, it will be understood that FETs can include, for example, metal-oxide-semiconductor FETs (MOSFETs) such as SOI MOSFETs. It will also be understood that FETs as described herein can be implemented in a number of process technologies, including but not limited to HEMT, SOI, silicon-on-sapphire (SOS), and CMOS technologies.

FIG. 2 shows that in some embodiments, a FET 300 for a stack can be implemented in a finger configuration. Although various examples are described herein in the context of such a finger configuration, other FET configurations can also be implemented and benefit from one or more features of the present disclosure.

In the example, the FET 300 is shown to include an active region 302 having a dimension of length L and width Wg. Although described in the example context of a rectangular shape, it will be understood that other shapes of active region are also possible.

A plurality of source(S) and drain (D) contacts are shown to be implemented in a finger configuration, with gate fingers (304, with gate length Lg) interleaved therebetween. In some embodiments, each of the source and drain contacts (S, D) can form an ohmic metal contact with the active region 302, and each of the gate fingers 304 can include a metal contact coupled with the active region 302 through a gate oxide layer. Each of the source contacts S can be electrically connected to a first input node In, and each of the drain contacts D can be electrically connected to a first output node Out. It will be understood that each of S and D can be either an input or output, depending on a given layout. Each of the gates 304 can be electrically connected to a gate node G. Operation of such an FET as a switch element (e.g., by turning it ON or OFF by application of appropriate gate signals) can be implemented in known manners.

In some embodiments, one or more of the example FET parameters such as the active region length (e.g., L), gate width (e.g., Wg), gate length (e.g., Lg) can be different among at least some of the FETs in a stack. In the context of the active region length L, variation in such a FET parameter can be implemented by or facilitate, for example, different numbers of source-gate-drain units, length dimension (horizontal in the example depicted in FIG. 2) of the source, drain and/or gate fingers, or any combination thereof.

FIG. 3 shows an example side sectional view of a portion indicated in FIG. 2. The example in FIG. 3 shows an SOI configuration; however, it will be understood that one or more features of the present disclosure can also be implemented in other types of switching transistors.

In some embodiment, a source-gate-drain unit can include an insulator 322 formed over a substrate 320. A body 324 is shown to be formed over the insulator 322, and source/drain regions 326, 328 are shown to be formed on the body 324. The source/drain regions 326, 328 are shown to be separated by a portion of the body 324 below a gate 304 having a length dimension Lg. A gate oxide layer 330, having a thickness dimension d1, is shown to be provided between the gate 304 and the body 324.

In some embodiments, the gate length Lg, the gate oxide layer thickness d1, profiles of any doped areas in the FET, or any combination thereof, can be adjusted so as to yield a stack having at least some difference(s) in such parameter(s) among the FETs. The doped areas can include, for example, the source/drain regions 326, 328, the body 324, a halo region (not shown in FIG. 3), or any other doped area.

FIG. 4 schematically depicts a stack 200 having a plurality of individual FETs 300. N such FETs are shown to be connected in series between an input node (IN) and an output node (OUT), with the quantity N being a positive integer greater than 1. It will be understood that the input and output can be reversed in some embodiments, such that the OUT node receives a signal and the IN node outputs the signal.

As described herein, some or all of the FETs 300 in the stack 200 can have one or more parameters that are different from the other FETs. Examples of FETs having such different parameter(s) are described herein in greater detail.

FIG. 5A shows that in some embodiments, a stack of FETs, such as the example of FIG. 4, can be implemented with the FETs having a non-uniform distribution 330 of a FET parameter. Such a non-uniform distribution can be based on a distribution 332 of another parameter associated with the FETs. In the example of FIG. 5A, the non-uniform distribution 330 is referred to as a first parameter distribution; and the non-uniform distribution 332 is referred to as a second parameter distribution. Examples of such FET parameters associated with the first and second distributions 330, 332 are described herein in greater detail.

Figure 5B:
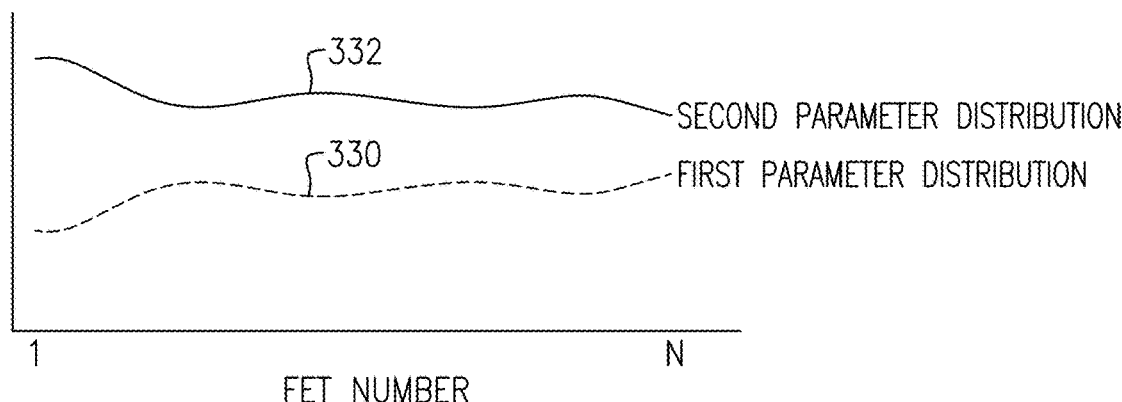
FIG. 5B shows an example where the first parameter distribution has a relationship with the second parameter distribution, where the relationship is different than the scaled tracking relationship in the example of FIG. 5A.

FIG. 5A shows an example where the first parameter distribution 330 can generally track the second parameter distribution 332. In some embodiments, however, other types of relationships can be implemented. For example, FIG. 5B shows an example where the first parameter distribution 330 has a relationship with the second parameter distribution 332, where the relationship is different than the scaled tracking relationship in the example of FIG. 5A. Such a relationship can include, for example, a situation where the first parameter distribution 330 increases when the second parameter distribution 332 decreases, and vice versa. Other types of relationships are also possible.

In each of the examples of FIGS. 5A and 5B, the first parameter distribution 330 that is implemented or is to be implemented in a stack, is depicted as a continuous function based on its respective second parameter distribution 332. For example, for a given FET number, the first parameter distribution 330 can have any value. However, it may not be desirable or practical to vary the parameter for every FET in such a continuous or fine manner.

Figure 6:
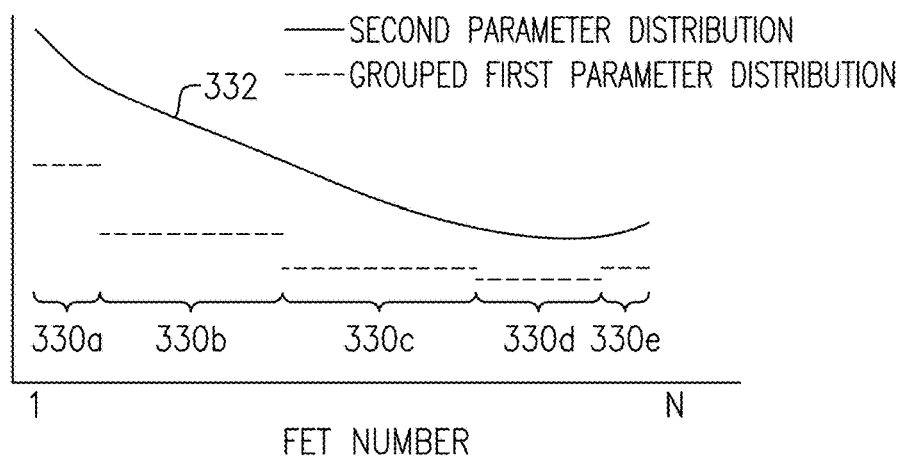
FIG. 6 shows that in some embodiments, the first parameter distribution can include a plurality of groups of values, where FETs in each group have a common parameter value.

FIG. 6 shows that in some embodiments, the first parameter distribution can include a plurality of groups of values, where FETs in each group have a common parameter value. For example, a group (330a) of FETs is shown to have a common value for the FET parameter for a corresponding range of the second parameter distribution. Similarly, a group (330b) of FETs is shown to have a common value for the FET parameter for a corresponding range of the second parameter distribution. Overall, the trend of the grouped common values (330a-330e) can generally track the second parameter distribution 332. It will be understood that other types of relationships (such as the example of FIG. 5B) can also be implemented with the foregoing grouping of FET parameter values.

FIGS. 7-10 show examples of how a FET parameter such as a gate length Lg can be mapped for a stack of FETs, based on another FET parameter such as a voltage across a FET (VDS). In such examples, a distribution of Lg values can be the first parameter distribution described herein in reference to FIGS. 5 and 6; and a distribution of VDS values can be the second parameter distribution. The examples of FIGS. 7-10 also demonstrate how performance of the stack can be improved for different operating parameters based on such mapping of the first parameter (e.g., Lg values). In some implementations, such improvement(s) can be achieved without sacrificing performance in other operating parameter(s).

Figure 7:
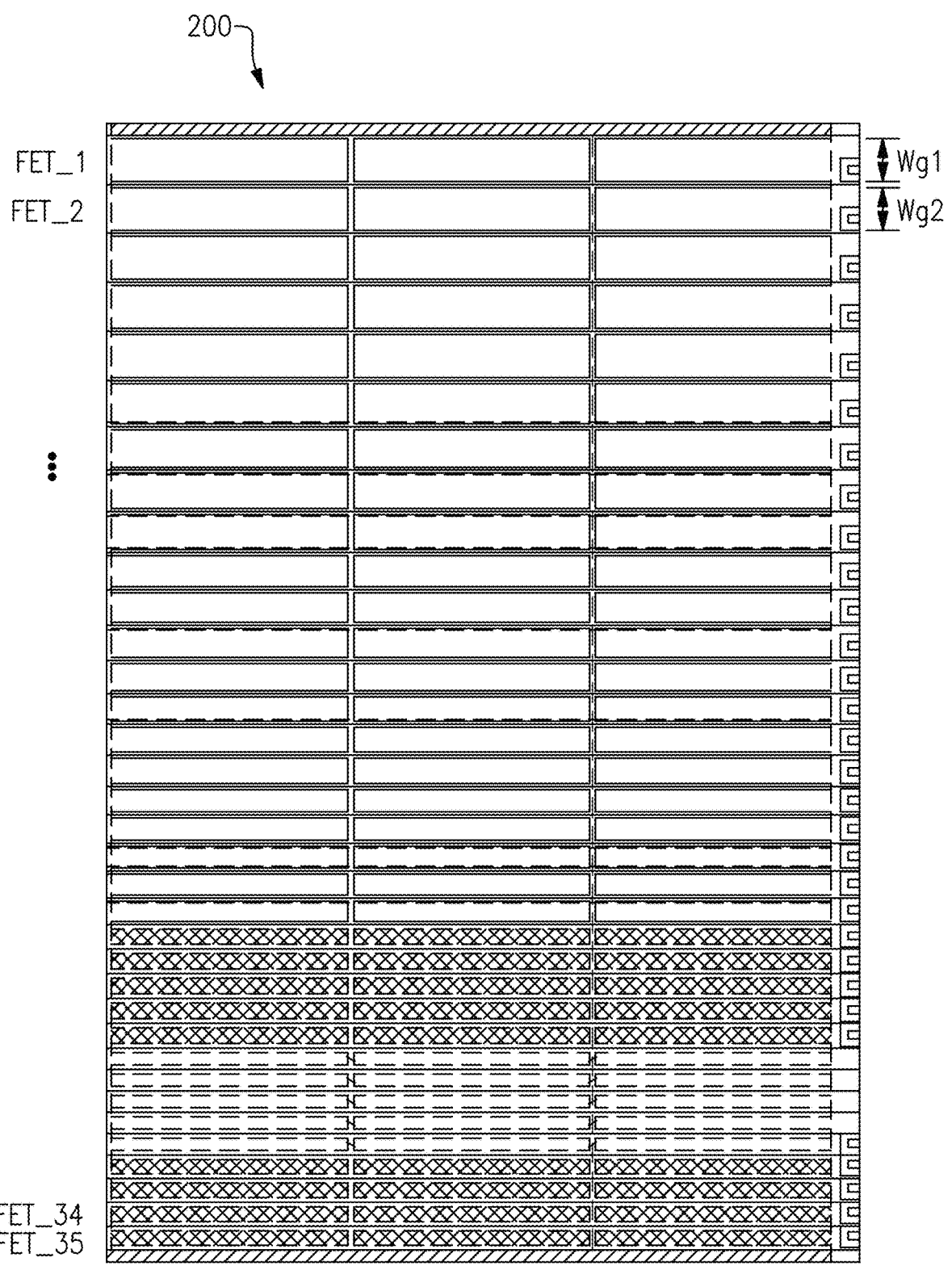
FIG. 7 shows an example stack having 35 FETs in which varying values of, for example, gate width can be implemented so as to reduce voltage division imbalance within the stack.

FIG. 7 shows a stack 200 having 35 FETs (FET_1, FET_2, . . . , FET_35). It will be understood that other numbers of FETs can be utilized. In the example, the FETs are shown to have varying values of gate width (Wg in FIG. 2, Wg1, Wg2, etc. in FIG. 7) so as to, for example, reduce voltage division imbalance within the stack 200. Additional details concerning such a technique can be found in U.S. patent application Ser. No. 14/451,321, entitled FIELD-EFFECT TRANSISTOR STACK VOLTAGE COMPENSATION, which is expressly incorporated by reference in its entirety.

For example, a stack having 10 FETs with respective gate widths Wg1 to Wg10 are listed in Table 1. Each of the 10 FETs in Table 1 has 100 gate fingers.

TABLE 1

| FET # | Gate width | Gate width value (μm) |
|-------|------------|-----------------------|
| 1 | Wg1 | 13.6 |
| 2 | Wg2 | 11.9 |
| 3 | Wg3 | 10.8 |
| 4 | Wg4 | 10.0 |
| 5 | Wg5 | 9.5 |
| 6 | Wg6 | 8.9 |
| 7 | Wg7 | 8.5 |
| 8 | Wg8 | 8.3 |

TABLE 1-continued

| FET # | Gate width | Gate width value (μm) |
|---|---|---|
| 9 | Wg9 | 8.2 |
| 10 | Wg10 | 8.5 |

For such variable-dimension FETs, it is shown by simulated data that relative voltage drop at each of the FETs is much more uniform than a configuration of 10 FETs having a constant gate width (e.g., 10 μm).

For example, in the constant gate width configuration, there is a voltage drop of about 0.135 of an input voltage (e.g., 5V) across FET1, about 0.118 of the input voltage across FET2, and so on, with the voltage drop decreasing to about 0.087 of the input voltage across FET9 (and increasing slightly for FET10). For the variable dimension configuration of Table 1, there is a voltage drop of about 0.103 of the input voltage (e.g., 5V) across FET1, about 0.101 of the input voltage across each of FET2 to FET10. Thus, one can see that voltage imbalance can be reduced drastically by the variable dimension configuration of Table 1 so as to yield a generally even voltage distribution. In some embodiments, such a relatively even voltage distribution along the stack can result in improvement of switch performance with respect to, for example, harmonic peaking, compression point and/or intermodulation distortion (IMD).

It is further noted that in the foregoing even voltage distribution example, the highest value is approximately 0.103 of the input voltage (across the first FET). Accordingly, a breakdown voltage of the example stack of Table can be estimated by scaling the input voltage (e.g., 5V) with the weak link having the highest relative voltage drop (e.g., 0.103 for the first FET). One can see that such an estimate desirably yields a value of 5/0.103, or approximately 48V, which is very close to the estimate for an ideal configuration that does not have voltage imbalance.

Figure 8:
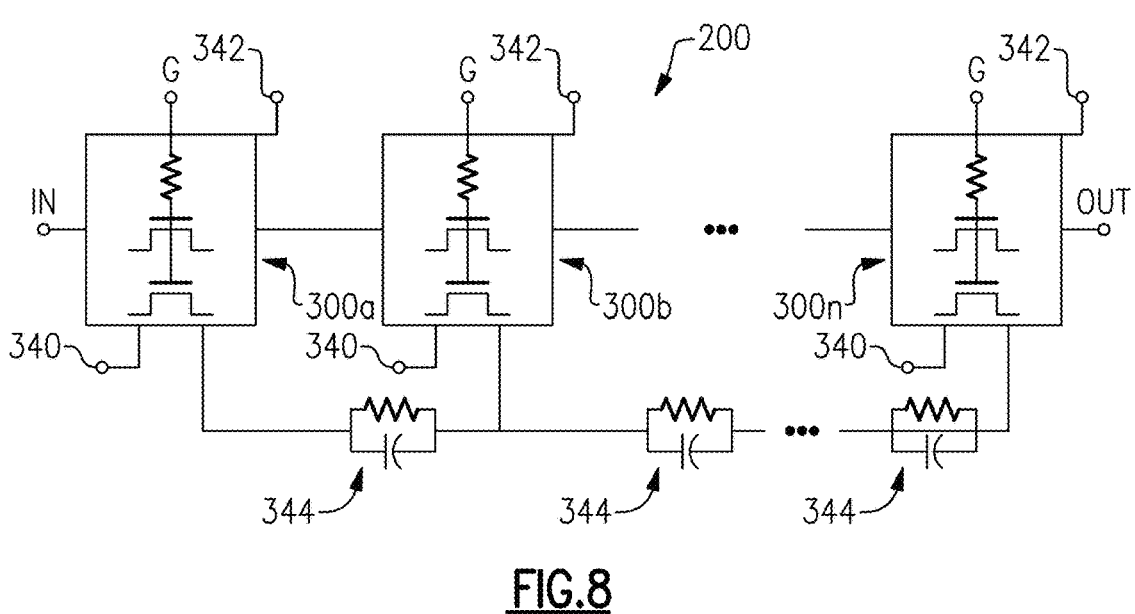
FIG. 8 shows a circuit representation of the example stack of FIG. 7.

FIG. 8 shows a circuit representation of the example stack 200 of FIG. 7. As shown, 35 FETs (300a, 300b, . . . , 300n) can be connected in series, with the first FET 300a being in communication with an input node (IN), and the last FET 300n being in communication with an output node (OUT). As described herein the stack 200 can be operated in reverse in some implementations, such that the input signal is provided at the OUT terminal and the output signal is provided at the IN terminal.

In the example circuit of FIG. 8, each FET is depicted as having a plurality of gate fingers in communication with a gate signal node G through a gate resistance. Such gate nodes can be controlled together for all of the FETs, individually, or some combination thereof.

In the example circuit, nodes 342 (e.g., 304 in FIG. 3) are the same as the gate nodes G, and a body node for each FET is indicated as 340. Further, parallel-RC circuits 344 are shown to provide example substrate coupling.

For the example stack configuration of FIGS. 7 and 8, a simulation was performed with a fixed value of Lg (e.g., approximately 0.32 μm) for all of the 35 FETs. Voltage values across the respective FETs observed in such a simulation are listed in Table 2, under the VDS column. The same VDS values are plotted in FIG. 9 (curve 352), along with the fixed Lg value (line 350).

TABLE 2

| FET Number | VDS (V) | Fixed Lg (μm) |
|---|---|---|
| 1 | 3.00 | 0.32 |
| 2 | 2.96 | 0.32 |
| 3 | 2.92 | 0.32 |
| 4 | 2.78 | 0.32 |
| 5 | 2.76 | 0.32 |
| 6 | 2.71 | 0.32 |
| 7 | 2.70 | 0.32 |
| 8 | 2.77 | 0.32 |
| 9 | 2.65 | 0.32 |
| 10 | 2.63 | 0.32 |
| 11 | 2.62 | 0.32 |
| 12 | 2.57 | 0.32 |
| 13 | 2.51 | 0.32 |
| 14 | 2.47 | 0.32 |
| 15 | 2.40 | 0.32 |
| 16 | 2.38 | 0.32 |
| 17 | 2.29 | 0.32 |
| 18 | 2.19 | 0.32 |
| 19 | 2.15 | 0.32 |
| 20 | 2.04 | 0.32 |
| 21 | 1.96 | 0.32 |
| 22 | 1.93 | 0.32 |
| 23 | 1.85 | 0.32 |
| 24 | 1.76 | 0.32 |
| 25 | 1.80 | 0.32 |
| 26 | 1.79 | 0.32 |
| 27 | 1.82 | 0.32 |
| 28 | 1.85 | 0.32 |
| 29 | 1.79 | 0.32 |
| 30 | 1.86 | 0.32 |
| 31 | 1.93 | 0.32 |
| 32 | 2.08 | 0.32 |
| 33 | 2.12 | 0.32 |
| 34 | 2.14 | 0.32 |
| 35 | 2.18 | 0.32 |

In some implementations, a larger gate length Lg typically yields a higher breakdown voltage (BVdss). In some situations, higher values of BVdss are desirable; however, there is typically a limit on how much Lg can be increased without significantly degrading other performance parameter(s) of the FET.

Figure 9:
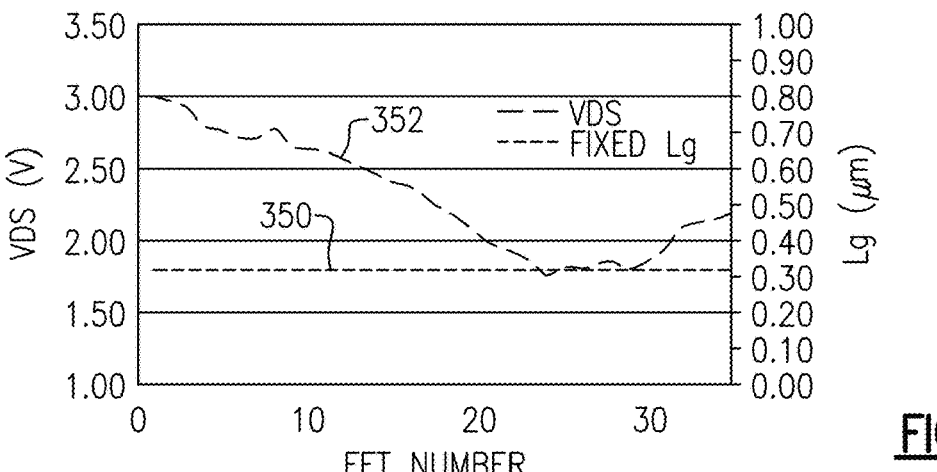
FIG. 9 shows an example distribution of voltage values across the FETs of a stack having a fixed Lg value.

In the example of FIG. 9 and Table 1, the highest VDS value is associated with the first FET, at approximately 3.00V, which is preferably below the breakdown voltage BVdss for that FET. Near the other end, the lowest VDS value is approximately 1.76V for FET 24. Thus, a constant gate length value Lg (e.g., 0.32 μm) for all of the FETs having such a range of VDS values is not an efficient implementation of a gate dimension such as Lg. For example, a FET may be able have a larger Lg value than the constant value (e.g., 0.32 μm) so as to increase BVdss without significantly degrading performance. In another example, a FET may be able to have a lower Lg value than the constant value (e.g., 0.32 μm) because BVdss may not need to be as high.

In some embodiments, a FET stack such as the examples described herein can be tuned for a more efficient implementation of a FET parameter such as gate length Lg. With such a tuned configuration, the stack as a whole can benefit significantly. Examples associated with such tuning and benefits that can be realized are described herein in greater detail.

In some implementations, the foregoing tuning technique can include identification of a distribution of VDS across a stack. Such a distribution can be obtained by, for example, simulation and/or measurement. The VDS curve 352 in FIG. 9 is an example of such a distribution.

Based on some configuration (e.g., type and/or process technology) associated with the FETs of the stack, the highest VDS value (e.g., the first FET) of the foregoing VDS-distribution can be scaled up to a higher value that is still below the breakdown voltage BVdss with an increased gate length Lg that is still acceptable (e.g., in terms of its effects on other FET performance parameters). With such a scaled VDS value, the VDS-distribution can be scaled up accordingly. For example, the VDS-distribution (e.g., curve 352 in FIG. 9) can be scaled up by approximately 12%.

Figure 10:
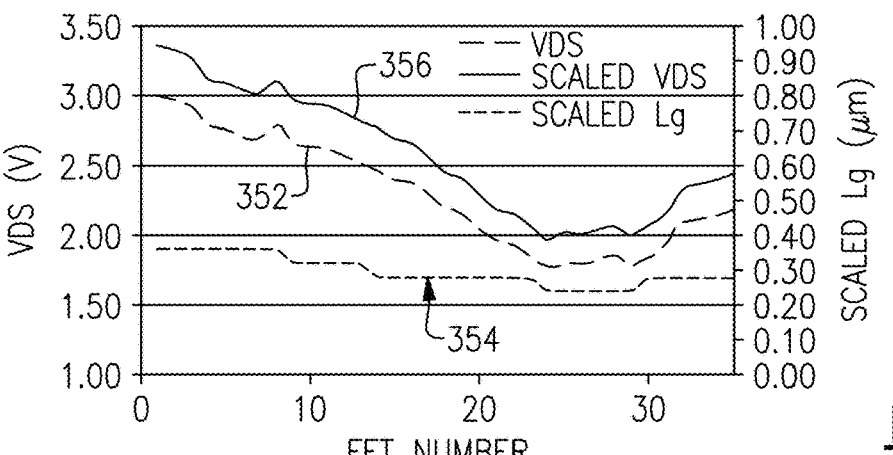
FIG. 10 shows am example where the voltage distribution of FIG. 9 can be adjusted to yield a scaled distribution by implementation of a non-uniform Lg distribution.

FIG. 10 shows the same un-scaled VDS curve 352 of FIG. 9, as well as a scaled VDS curve 356 that is approximately 1.12 times the curve 352. Values associated with the un-scaled VDS curve 352 and the scaled VDS curve 356 are listed in Table 3 under columns indicated as "VDS" and "Scaled VDS." In some embodiments, and as shown by example in FIG. 10 and Table 3, the scaled VDS values for a given Lg value can remain at or below a maximum or selected VDS value.

For example, FETs 1-8 having Lg of 0.36 μm are shown to have scaled VDS values that are less than or equal to a corresponding selected VDS value of 3.5V. Similarly, FETs 9-13 having Lg of 0.32 μm are shown to have scaled VDS values that are less than or equal to a corresponding selected VDS value of 3.0V; FETs 14-23 having Lg of 0.28 μm are shown to have scaled VDS values that are less than or equal to a corresponding selected VDS value of 2.8V; FETs 24-29 having Lg of 0.24 μm are shown to have scaled VDS values that are less than or equal to a corresponding selected VDS value of 2.0V; and FETs 30-35 having Lg of 0.28 μm are shown to have scaled VDS values that are less than or equal to a corresponding selected VDS value of 2.8V.

TABLE 3

| FET Number | VDS (V) | Scaled VDS (V) | Scaled Lg (μm) |
| --- | --- | --- | --- |
| 1 | 3.00 | 3.36 | 0.36 |
| 2 | 2.96 | 3.32 | 0.36 |
| 3 | 2.92 | 3.27 | 0.36 |
| 4 | 2.78 | 3.11 | 0.36 |
| 5 | 2.76 | 3.09 | 0.36 |
| 6 | 2.71 | 3.04 | 0.36 |
| 7 | 2.70 | 3.02 | 0.36 |
| 8 | 2.77 | 3.10 | 0.36 |
| 9 | 2.65 | 2.97 | 0.32 |
| 10 | 2.63 | 2.94 | 0.32 |
| 11 | 2.62 | 2.93 | 0.32 |
| 12 | 2.57 | 2.88 | 0.32 |
| 13 | 2.51 | 2.81 | 0.32 |
| 14 | 2.47 | 2.77 | 0.28 |
| 15 | 2.40 | 2.69 | 0.28 |
| 16 | 2.38 | 2.66 | 0.28 |
| 17 | 2.29 | 2.57 | 0.28 |
| 18 | 2.19 | 2.45 | 0.28 |
| 19 | 2.15 | 2.41 | 0.28 |
| 20 | 2.04 | 2.29 | 0.28 |
| 21 | 1.96 | 2.19 | 0.28 |
| 22 | 1.93 | 2.16 | 0.28 |
| 23 | 1.85 | 2.07 | 0.28 |
| 24 | 1.76 | 1.97 | 0.24 |
| 25 | 1.80 | 2.02 | 0.24 |
| 26 | 1.79 | 2.01 | 0.24 |
| 27 | 1.82 | 2.04 | 0.24 |
| 28 | 1.85 | 2.07 | 0.24 |
| 29 | 1.79 | 2.01 | 0.24 |
| 30 | 1.86 | 2.08 | 0.28 |
| 31 | 1.93 | 2.16 | 0.28 |
| 32 | 2.08 | 2.33 | 0.28 |
| 33 | 2.12 | 2.37 | 0.28 |
| 34 | 2.14 | 2.40 | 0.28 |
| 35 | 2.18 | 2.44 | 0.28 |

With the foregoing increased gate length Lg (e.g., 0.36 μm) corresponding to BVdss of the highest VDS FET (e.g., the first FET), a new Lg-distribution can be obtained. An example of such a new Lg-distribution is shown in FIG. 10 as a distribution 354, and the corresponding values are listed in Table 3 under the column indicated as "Scaled Lg."

It is noted that the example Lg values in FIG. 10 and Table 3 are grouped in five groups, similar to the example described herein in reference to FIG. 6. It is also noted that the Lg values associated with the five groups generally follow the trend of the scaled VDS curve 356. Table 4 lists an example scheme that assigns different values for different ranges of the scaled VDS curve 356.

TABLE 4

| Range (V) | Lg (μm) |
| --- | --- |
| 3.0 ≤ VDS < 3.5 | 0.36 |
| 2.8 ≤ VDS < 3.0 | 0.32 |
| 2.0 ≤ VDS < 2.8 | 0.28 |
| VDS < 2.0 | 0.24 |

In some situations, the new Lg distribution obtained in the foregoing example manner may or may not alter the VDS distribution in a way that is sub-optimal or undesirable. If such a VDS distribution is sub-optimal or undesirable, one or more steps of the foregoing technique can be modified.

As described herein, a new Lg distribution obtained in the foregoing manner can yield a tuned stack of FETs. For example, Lg some values can be increased (e.g., 0.36 μm which is greater than the constant value of 0.32 μm) for FET(s) that need such higher values. On the other hand, some Lg values can be decreased (e.g., 0.24 μm which is less than the constant value of 0.32 μm) for FET(s) that do not need higher values. Such a tuned configuration can provide a number of performance improvements for the stack. Non-limiting examples of such performance improvements are described below.

Improved Voltage Handling Capability

As described herein, one or more features of the present disclosure can improve the voltage handling capability of a stack of FETs. Voltage handling of a FET is typically specified in terms of a breakdown voltage (BVdss) at which point the leakage current increases and levels of harmonics increase sharply.

The example tuning configuration described herein in reference to the scaled VDS distribution 356 of FIG. 10 has a total VDS value of approximately 90V (sum of the Scaled VDS values for the 35 FETs in Table 3), while the un-scaled VDS distribution 352 has a total VDS value of approximately 80V. Thus, the tuned configuration is shown to provide approximately an extra 10V of voltage handling capability for the stack.

The foregoing example improvement in voltage handling capability is described in the context of tuning the gate lengths of the various FETs in the stack. It will be understood that other FET parameters can also be tuned to achieve similar results. For example, breakdown voltage (BVdss) optimization or improvement can be achieved by doping profile and/or construction modification. Modification(s) can be made in doping of the source, drain, body, halo region and/or any other doped area to increase or decrease the BVdss. In some embodiments, such FET devices can be fabricated by further processing steps (e.g., extra masks) or use of different construction and/or layout.

In another example, use of thicker gate oxide layers (e.g., 330 in FIG. 3) can yield higher breakdown voltage. However, such an increase in BVdss can result in degradation of other parameters such as Ron. Accordingly, tuning of a stack based on the gate oxide layer thickness can be achieved by balancing the conflicting performance parameters.

Although the various examples for the voltage handling improvement are described in the context of a stack of FETs, it will be understood that one or more features of the present disclosure can also be applied to other stacked devices. For example, in the context of a stack having micro-electro-mechanical systems (MEMS) devices such as MEMS-capacitors or MEMS-switches, parameters such as beam length, width, and/or thickness can be tuned to achieve improved voltage handling capability.

Improved Ron Performance:

As described herein, one or more features of the present disclosure can improve the Ron performance of a stack of FETs. Typically, voltage handling capability and Ron vary in the same direction. Thus, in some embodiments, if a first FET does not need to withstand as much voltage as a second FET, the first FET can be configured with a Ron that is lower than the Ron of the second FET.

In some implementations, a design for a stack of FETs can include a feature of decreasing Ron while maintaining the voltage handling capability. For such a design, use of FETs with having desirable characteristics for both BVdss and Ron (e.g., lower BVdss and lower Ron) can be utilized. For example, if the initial design uses a 0.32 μm FET, a new FET with Lg<0.32 μm can be utilized if that FET is not subjected to a higher voltage.

As described herein in the context of the examples associated with FIGS. 7-10, Lg can be adjusted to tune the voltage handling capability of each FET or groups of FETs, thereby yielding a higher voltage handling capability for the stack as a whole. In such a design, it is noted that some Lg values may be higher than the Lg values in the original design, thereby increasing the Ron values for those FETs. However, because such a tuned configuration can include some FETs having lower Lg values, the stack overall can have a lower Ron value.

For example, in the Lg values listed in Tables 2 and 3, the sum of fixed Lg values in the original design (0.32 μm for each FET in Table 2) is approximately 11.2 μm. In Table 3, the sum of varying Lg values is approximately 10.4 μm. Thus, in such particular examples, both of the voltage handling capability and the Ron performance are improved, with the former increasing and the latter decreasing. If a design calls for an improved Ron performance with a lowered Ron value for a stack while maintaining the overall voltage handling capability, one can see that the stack's Ron value can be lowered even further, since the voltage handling capability does not need to increase.

The foregoing example improvement in Ron performance is described in the context of tuning the gate lengths of the various FETs in a stack. It will be understood that other FET parameters can also be tuned to achieve similar results. For example, Ron optimization or improvement can be achieved by doping profile and/or construction modification. Modification(s) can be made in doping of the source, drain, body, halo region and/or any other doped area to increase or decrease Ron. In some embodiments, such FET devices can be fabricated by further processing steps (e.g., extra masks) or use of different construction and/or layout.

In another example, use of thinner gate oxide layers (e.g., 330 in FIG. 3) can yield lower Ron values. However, such a decrease in Ron can result in unwanted degradation of other parameters such as BVdss. Accordingly, tuning of a stack based on the gate oxide layer thickness can be achieved by balancing the conflicting performance parameters.

Although the various examples for the Ron performance improvement are described in the context of a stack of FETs, it will be understood that one or more features of the present disclosure can also be applied to other stacked devices. For example, in the context of a stack having micro-electro-mechanical systems (MEMS) devices such as MEMS-capacitors or MEMS-switches, parameters such as beam length, width, and/or thickness can be tuned to achieve improved Ron performance.

Improved Linearity Performance:

In some implementations, one or more features of the present disclosure can be utilized to improve linearity performance of a stack of FETs, when the stack is ON and/or when the stack is OFF. When the stack is ON, improvement in linearity performance of the stack can be achieved by reducing the overall Ron of the stack. In some embodiments, such a reduction in the overall Ron can be implemented through a use of FETs having shorter gate lengths as described herein. Other techniques described herein under the section "Improved Ron Performance" can also be utilized to reduce the overall Ron. Such a reduction in the overall Ron can reduce the voltage developed across the ON stack, and thus reduce the harmonics or other non-linearity effects generated by the stack.

When the stack is OFF, improvement in linearity performance can be achieved by configuring some of the FETs in the stack to operate near breakdown (e.g., by using FETs having higher BVdss), and using higher linearity FETs that are operated well below their breakdown voltages for some or all of the other FETs in the stack.

When the stack is ON or OFF, improvement in linearity performance can be achieved by reducing the layout area of the stack. Such a reduction in layout area can reduce the coupling of the stack with the substrate, thereby reducing non-linearity effects that can be driven by the substrate. In some embodiments, such a reduction in layout area can be achieved by, for example, reducing the gate length Lg when appropriate as described herein, and/or reducing the gate width Wg when appropriate, also as described herein.

In some situations, the foregoing example improvement in linearity performance can be implemented by tuning the gate lengths of the various FETs in the stack. It will be understood that other FET parameters can also be tuned to achieve similar results. For example, linearity optimization or improvement can be achieved by doping profile and/or construction modification. Modification(s) can be made in doping of the source, drain, body, halo region and/or any other doped area to affect linearity. In some embodiments, such FET devices can be fabricated by further processing steps (e.g., extra masks) or use of different construction and/or layout.

In the context of improving linearity performance by reduction in Ron, use of thinner gate oxide layers (e.g., 330 in FIG. 3) can yield lower Ron values. However, such a decrease in Ron can result in unwanted degradation of other parameters such as BVdss. Accordingly, tuning of a stack based on the gate oxide layer thickness can be achieved by balancing the conflicting performance parameters.

Although the various examples for the linearity performance improvement are described in the context of a stack of FETs, it will be understood that one or more features of the present disclosure can also be applied to other stacked devices. For example, in the context of a stack having micro-electro-mechanical systems (MEMS) devices such as MEMS-capacitors or MEMS-switches, parameters such as beam length, width, and/or thickness can be tuned to achieve improved linearity performance.

Figures 11, 12:
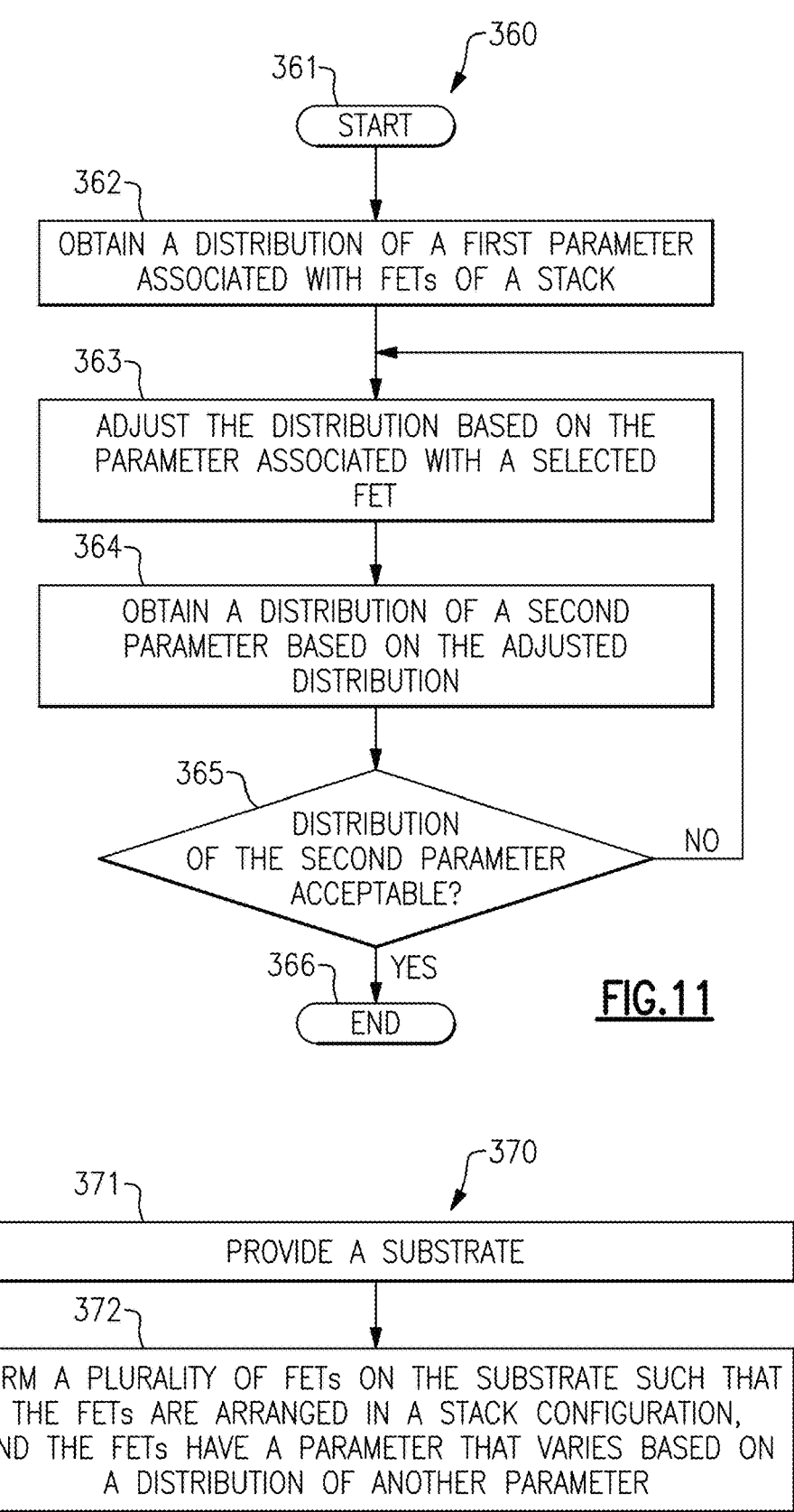
FIG. 11 shows a process that can be implemented to configure a stack having one or more features as described herein.
FIG. 12 shows a process that can be implemented to fabricate a stack having one or more features described herein.

Example Method of Configuring a Stack:

FIG. 11 shows a process 360 that can be implemented to configure a stack having one or more features as described herein. The process 360 can begin at block 361; and in block 362, a distribution of a first parameter associated with FETs of a stack can be obtained. In block 363, the obtained distribution can be adjusted based on the parameter associated with a selected FET. For example, the first FET in a stack can have the highest voltage VDS, and the distribution can be adjusted based on such a VDS value. In block 364, a distribution of a second parameter can be obtained based on the adjusted distribution. In a decision block 365, the process 360 can determine whether the distribution of the second parameter is acceptable. If the answer is "Yes," the process 360 can end in block 366. If the answer is "No," the process 360 can perform steps 363 and 364 to generate another distribution of second parameter.

Example Method of Fabricating a Stack:

FIG. 12 shows a process 370 that can be implemented to fabricate a stack having one or more features described herein. In block 371, a substrate can be provided. In some embodiments, such a substrate can be an SOI substrate. In block 372, a plurality of FETs can be formed on the substrate such that the FETs are arranged in a stack configuration. The FETs can have a parameter that varies based on a distribution of another parameter.

Figure 13:
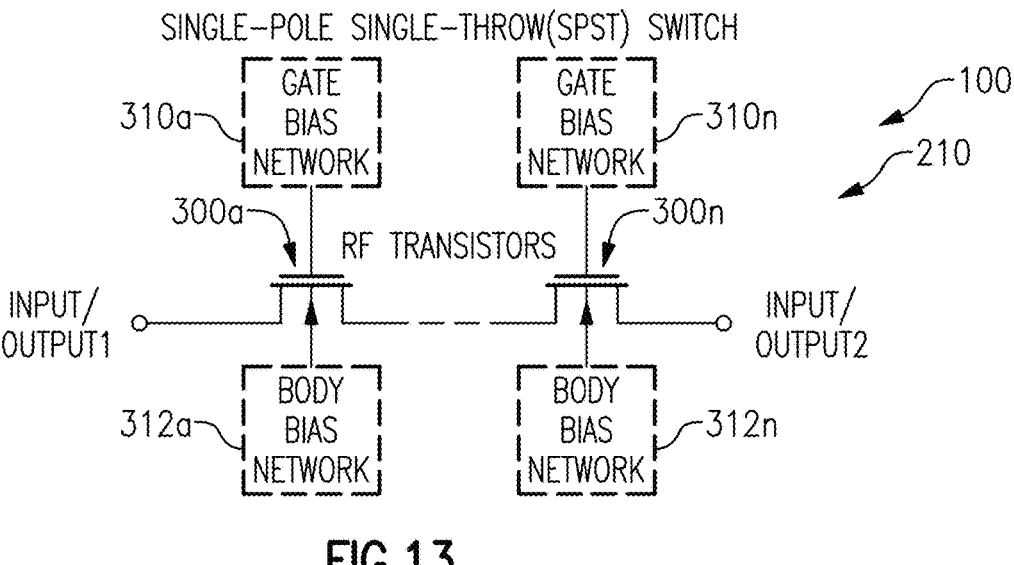
FIG. 13 shows an example of an RF switch having a stack of a plurality of FETs.

Examples of Switching Applications:

In some embodiments, a FET stack having two or more FETs can be implemented as an RF switch. FIG. 13 shows an example of an RF switch having a stack 210 of a plurality of FETs (e.g., N of such FETs 300a to 300n). Such a switch can be configured as a single-pole-single-throw (SPST) switch. Although described in the context of such an example, it will be understood that one or more of stacks 210 can be implemented in other switch configurations.

In the example of FIG. 13, each of the FETs (300a to 300n) can be controlled by its respective gate bias network 310 and body bias network 312. In some implementations, such control operations can be performed in known manners.

Figure 14:
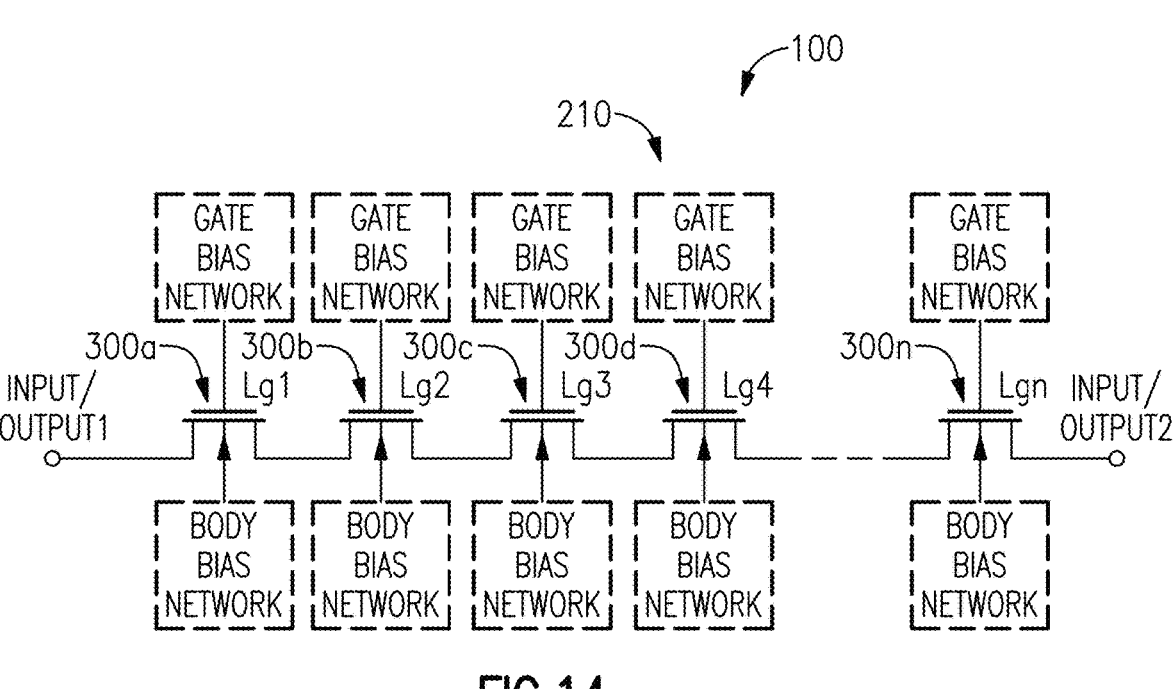
FIG. 14 shows an example RF switch where dimension variation of the FETs can be implemented as, for example, different gate lengths.

In some embodiments, an RF switch such as the example of FIG. 13 can include FETs having one or more features described herein. FIG. 14 shows an example RF switch 100 where such features can be implemented as different gate lengths. In the example, an FET stack 210 is shown to include FETs (300a-300n) with their respective gate lengths (Lg1-Lgn). Some or all of such gate lengths can be selected to be different so as to yield a desirable performance improvement for the RF switch 100.

FIGS. 15-20 show non-limiting examples of switching applications where one or more features of the present disclosure can be implemented. FIGS. 21 and 22 show examples where one or more features of the present disclosure can be implemented in SOI devices. FIG. 23-26 show examples of how one or more features of the present disclosure can be implemented in different products.

Figures 15, 16:
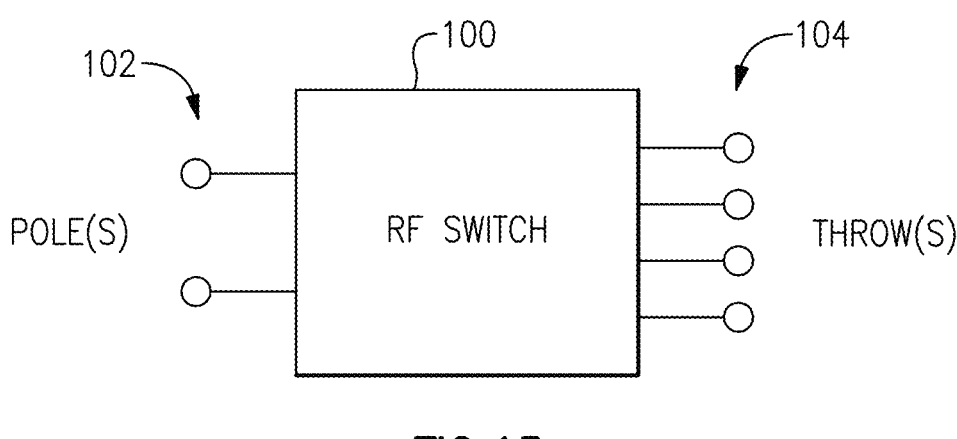
FIG. 15 depicts an RF switch configured to switch one or more signals between one or more poles and one or more throws.
FIG. 16 shows that in some embodiments, the RF switch of FIG. 15 can include an RF core and an energy management (EM) core.

Example Components of a Switching Device:

FIG. 15 shows a radio-frequency (RF) switch 100 configured to switch one or more signals between one or more poles 102 and one or more throws 104. In some embodiments, such a switch can be based on one or more field-effect transistors (FETs) such as silicon-on-insulator (SOI) FETs. When a particular pole is connected to a particular throw, such a path is commonly referred to as being closed or in an ON state. When a given path between a pole and a throw is not connected, such a path is commonly referred to as being open or in an OFF state.

FIG. 16 shows that in some implementations, the RF switch 100 of FIG. 15 can include an RF core 110 and an energy management (EM) core 112. The RF core 110 can be configured to route RF signals between the first and second ports. In the example single-pole-double-throw (SPDT) configuration shown in FIG. 16, such first and second ports can include a pole 102a and a first throw 104a, or the pole 102a and a second throw 104b.

In some embodiments, the EM core 112 can be configured to supply, for example, voltage control signals to the RF core. The EM core 112 can be further configured to provide the RF switch 100 with logic decoding and/or power supply conditioning capabilities.

In some embodiments, the RF core 110 can include one or more poles and one or more throws to enable passage of RF signals between one or more inputs and one or more outputs of the switch 100. For example, the RF core 110 can include a single-pole double-throw (SPDT or SP2T) configuration as shown in FIG. 16.

Figure 17:
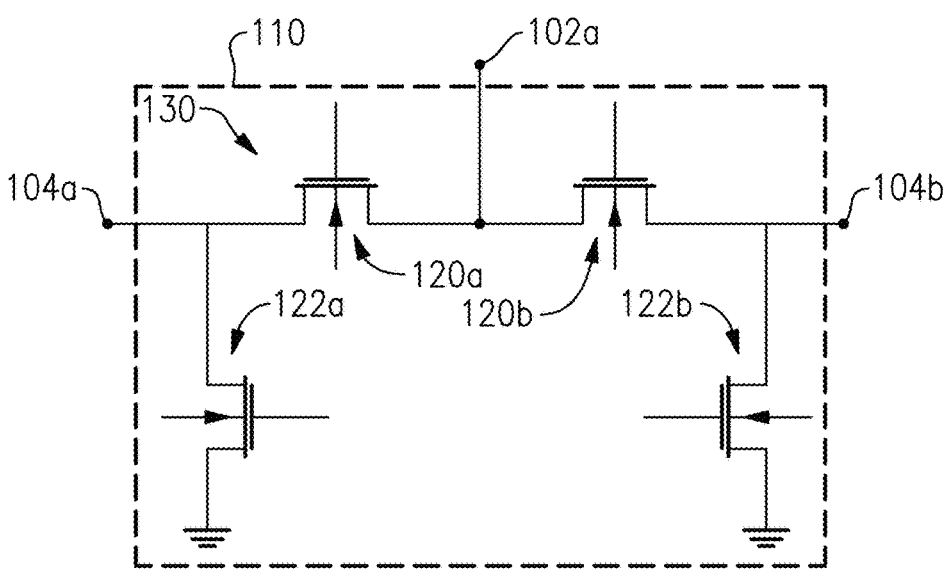
FIG. 17 shows a more detailed example configuration of the RF core of FIG. 16, implemented in an example SPDT (single-pole double-throw) configuration.

In the example SPDT context, FIG. 17 shows a more detailed example configuration of an RF core 110. The RF core 110 is shown to include a single pole 102a coupled to first and second throw nodes 104a, 104b via first and second transistors (e.g., FETs) 120a, 120b. The first throw node 104a is shown to be coupled to an RF ground via an FET 122a to provide shunting capability for the node 104a. Similarly, the second throw node 104b is shown to be coupled to the RF ground via an FET 122b to provide shunting capability for the node 104b.

In an example operation, when the RF core 110 is in a state where an RF signal is being passed between the pole 102a and the first throw 104a, the FET 120a between the pole 102a and the first throw node 104a can be in an ON state, and the FET 120b between the pole 102a and the second throw node 104b can be in an OFF state. For the shunt FETs 122a, 122b, the shunt FET 122a can be in an OFF state so that the RF signal is not shunted to ground as it travels from the pole 102a to the first throw node 104a. The shunt FET 122b associated with the second throw node 104b can be in an ON state so that any RF signals or noise arriving at the RF core 110 through the second throw node 104b is shunted to the ground so as to reduce undesirable interference effects to the pole-to-first-throw operation.

Although the foregoing example is described in the context of a single-pole-double-throw configuration, it will be understood that the RF core can be configured with other numbers of poles and throws. For example, there may be more than one poles, and the number of throws can be less than or greater than the example number of two.

In the example of FIG. 17, the transistors between the pole 102a and the two throw nodes 104a, 104b are depicted as single transistors. In some implementations, such switching functionalities between the pole(s) and the throw(s) can be provided by switch arm segments, where each switch arm segment includes a plurality of transistors such as FETs.

Figure 18:
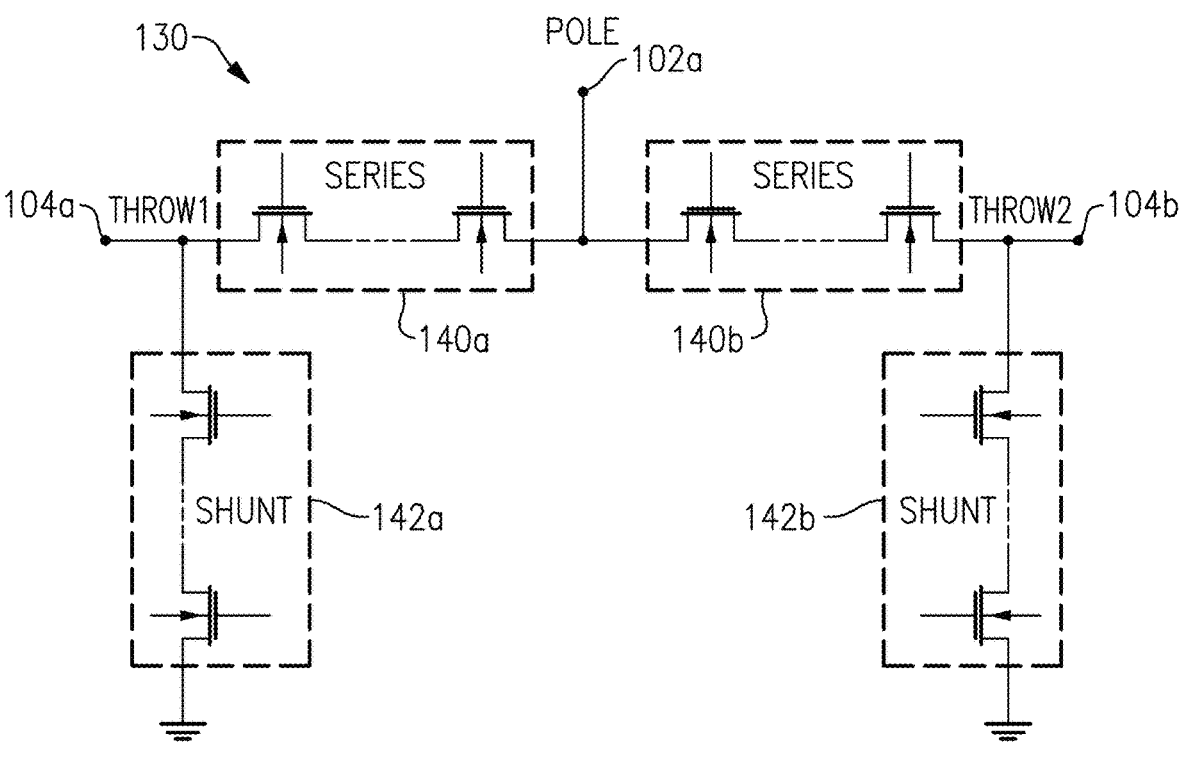
FIG. 18 shows an example where the SPDT configuration of FIG. 17 is implemented with a stack of FETs for each of a series arm and a shunt arm associated with each of the two throws.

An example RF core configuration 130 of an RF core having such switch arm segments is shown in FIG. 18. In the example, the pole 102a and the first throw node 104a are shown to be coupled via a first switch arm segment 140a. Similarly, the pole 102a and the second throw node 104b are shown to be coupled via a second switch arm segment 140b. The first throw node 104a is shown to be capable of being shunted to an RF ground via a first shunt arm segment 142a. Similarly, the second throw node 104b is shown to be capable of being shunted to the RF ground via a second shunt arm segment 142b.

In an example operation, when the RF core 130 is in a state where an RF signal is being passed between the pole 102a and the first throw node 104a, all of the FETs in the first switch arm segment 140a can be in an ON state, and all of the FETs in the second switch arm segment 104b can be in an OFF state. The first shunt arm 142a for the first throw node 104a can have all of its FETs in an OFF state so that the RF signal is not shunted to ground as it travels from the pole 102a to the first throw node 104a. All of the FETs in the second shunt arm 142b associated with the second throw node 104b can be in an ON state so that any RF signals or noise arriving at the RF core 130 through the second throw node 104b is shunted to the ground so as to reduce undesirable interference effects to the pole-to-first-throw operation.

Again, although described in the context of an SP2T configuration, it will be understood that RF cores having other numbers of poles and throws can also be implemented.

In some implementations, a switch arm segment (e.g., 140a, 140b, 142a, 142b) can include one or more semiconductor transistors such as FETs. In some embodiments, an FET may be capable of being in a first state or a second state and can include a gate, a drain, a source, and a body (sometimes also referred to as a substrate). In some embodiments, an FET can include a metal-oxide-semiconductor field effect transistor (MOSFET). In some embodiments, one or more FETs can be connected in series forming a first end and a second end such that an RF signal can be routed between the first end and the second end when the FETs are in a first state (e.g., ON state).

Figure 19:
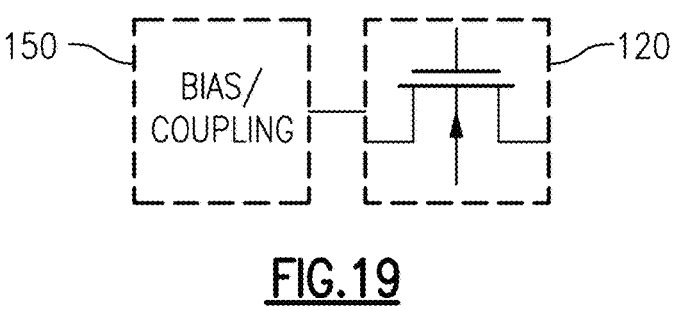
FIG. 19 shows that FETs having one or more features as described herein can be controlled by a circuit configured to provide bias and/or coupling functionality.

At least some of the present disclosure relates to how a FET or a group of FETs can be controlled to provide switching functionalities in desirable manners. FIG. 19 schematically shows that in some implementations, such controlling of an FET 120 can be facilitated by a circuit 150 configured to bias and/or couple one or more portions of the FET 120. In some embodiments, such a circuit 150 can include one or more circuits configured to bias and/or couple a gate of the FET 120, bias and/or couple a body of the FET 120, and/or couple a source/drain of the FET 120.

Figure 20:
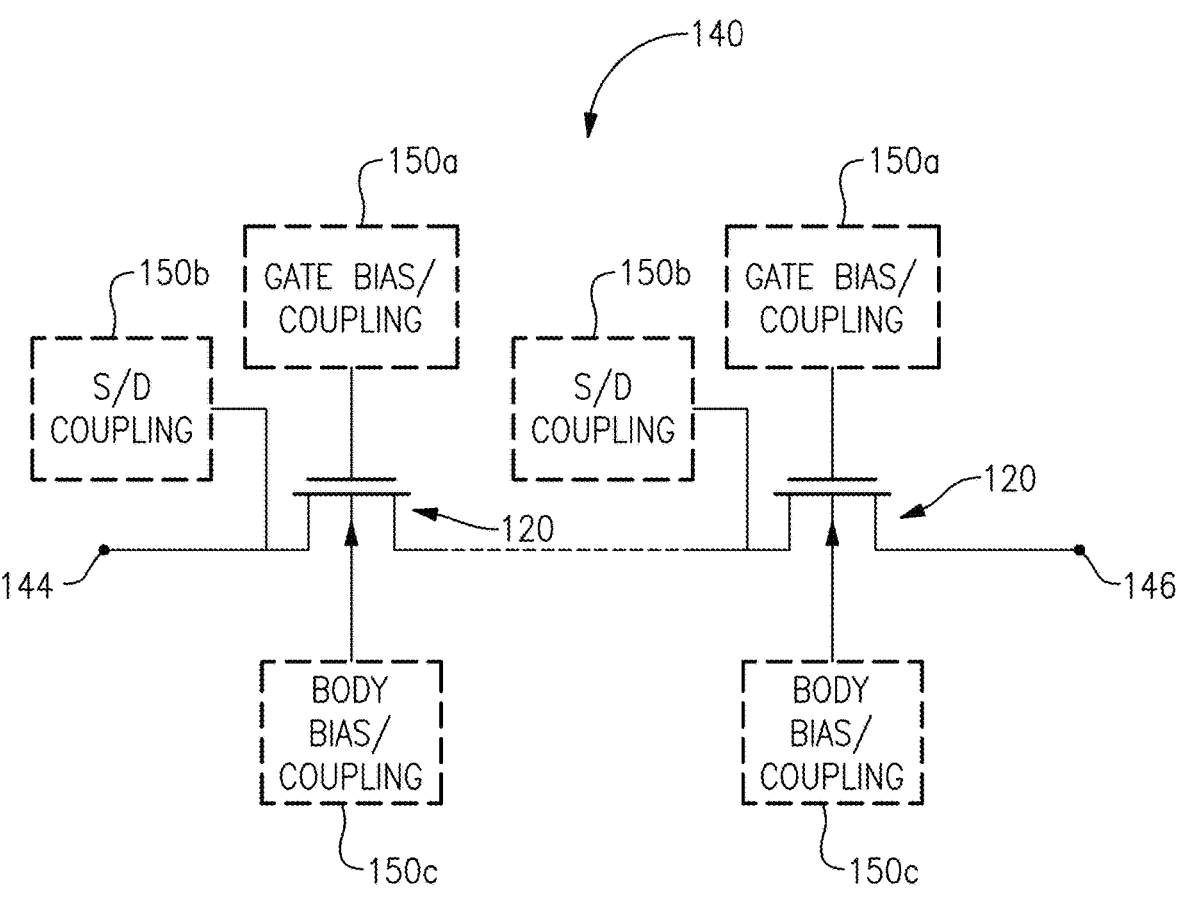
FIG. 20 shows examples of how biasing and/or coupling of different parts of one or more FETs can be implemented.

Schematic examples of how such biasing and/or coupling of different parts of one or more FETs are described in reference to FIG. 20. In FIG. 20, a switch arm segment 140 (that can be, for example, one of the example switch arm segments 140a, 140b, 142a, 142b of the example of FIG. 18) between nodes 144, 146 is shown to include a plurality of FETs 120. Operations of such FETs can be controlled and/or facilitated by a gate bias/coupling circuit 150a, and a body bias/coupling circuit 150c, and/or a source/drain coupling circuit 150b.

Gate Bias/Coupling Circuit

In the example shown in FIG. 20, the gate of each of the FETs 120 can be connected to the gate bias/coupling circuit 150a to receive a gate bias signal and/or couple the gate to another part of the FET 120 or the switch arm 140. In some implementations, designs or features of the gate bias/coupling circuit 150a can improve performance of the switch arm 140. Such improvements in performance can include, but are not limited to, device insertion loss, isolation performance, power handling capability and/or switching device linearity.

Body Bias/Coupling Circuit

As shown in FIG. 20, the body of each FET 120 can be connected to the body bias/coupling circuit 150c to receive a body bias signal and/or couple the body to another part of the FET 120 or the switch arm 140. In some implementations, designs or features of the body bias/coupling circuit 150c can improve performance of the switch arm 140. Such improvements in performance can include, but are not limited to, device insertion loss, isolation performance, power handling capability and/or switching device linearity.

Source/Drain Coupling Circuit

As shown in FIG. 20, the source/drain of each FET 120 can be connected to the coupling circuit 150b to couple the source/drain to another part of the FET 120 or the switch arm 140. In some implementations, designs or features of the coupling circuit 150b can improve performance of the switch arm 140. Such improvements in performance can include, but are not limited to, device insertion loss, isolation performance, power handling capability and/or switching device linearity.

Examples of Switching Performance Parameters:

Insertion Loss

A switching device performance parameter can include a measure of insertion loss. A switching device insertion loss can be a measure of the attenuation of an RF signal that is routed through the RF switching device. For example, the magnitude of an RF signal at an output port of a switching device can be less than the magnitude of the RF signal at an input port of the switching device. In some embodiments, a switching device can include device components that introduce parasitic capacitance, inductance, resistance, or conductance into the device, contributing to increased switching device insertion loss. In some embodiments, a switching device insertion loss can be measured as a ratio of the power or voltage of an RF signal at an input port to the power or voltage of the RF signal at an output port of the switching device. Decreased switching device insertion loss can be desirable to enable improved RF signal transmission.

Isolation

A switching device performance parameter can also include a measure of isolation. Switching device isolation can be a measure of the RF isolation between an input port and an output port an RF switching device. In some embodiments, it can be a measure of the RF isolation of a switching device while the switching device is in a state where an input port and an output port are electrically isolated, for example while the switching device is in an OFF state. Increased switching device isolation can improve RF signal integrity. In certain embodiments, an increase in isolation can improve wireless communication device performance.

Intermodulation Distortion

A switching device performance parameter can further include a measure of intermodulation distortion (IMD) performance. Intermodulation distortion (IMD) can be a measure of non-linearity in an RF switching device.

IMD can result from two or more signals mixing together and yielding frequencies that are not harmonic frequencies. For example, suppose that two signals have fundamental frequencies $f_1$ and $f_2$ ($f_2 > f_1$) that are relatively close to each other in frequency space. Mixing of such signals can result in peaks in frequency spectrum at frequencies corresponding to different products of fundamental and harmonic frequencies of the two signals. For example, a second-order intermodulation distortion (also referred to as IMD2) is typically considered to include frequencies $f_1 + f_2$ $f_2 - f_1$, $2f_1$, and $2f_2$. A third-order IMD (also referred to as IMD3) is typically considered to include $2f_1 + f_2$, $2f_1 - f_2$, $f_1 + 2f_2$, $f_1 - 2f_2$. Higher order products can be formed in similar manners.

In general, as the IMD order number increases, power levels decrease. Accordingly, second and third orders can be undesirable effects that are of particular interest. Higher orders such as fourth and fifth orders can also be of interest in some situations.

In some RF applications, it can be desirable to reduce susceptibility to interference within an RF system. Non linearity in RF systems can result in introduction of spurious signals into the system. Spurious signals in the RF system can result in interference within the system and degrade the information transmitted by RF signals. An RF system having increased non-linearity can demonstrate increased susceptibility to interference. Non-linearity in system components, for example switching devices, can contribute to the introduction of spurious signals into the RF system, thereby contributing to degradation of overall RF system linearity and IMD performance.

In some embodiments, RF switching devices can be implemented as part of an RF system including a wireless communication system. IMD performance of the system can be improved by increasing linearity of system components, such as linearity of an RF switching device. In some embodiments, a wireless communication system can operate in a multi-band and/or multi-mode environment. Improvement in intermodulation distortion (IMD) performance can be desirable in wireless communication systems operating in a multi-band and/or multi-mode environment. In some embodiments, improvement of a switching device IMD performance can improve the IMD performance of a wireless communication system operating in a multi-mode and/ or multi-band environment.

Improved switching device IMD performance can be desirable for wireless communication devices operating in various wireless communication standards, for example for wireless communication devices operating in the LTE communication standard. In some RF applications, it can be desirable to improve linearity of switching devices operating in wireless communication devices that enable simultaneous transmission of data and voice communication. For example, improved IMD performance in switching devices can be desirable for wireless communication devices operating in the LTE communication standard and performing simultaneous transmission of voice and data communication (e.g., SVLTE).

High Power Handling Capability

In some RF applications, it can be desirable for RF switching devices to operate under high power while reducing degradation of other device performance parameters. In some embodiments, it can be desirable for RF switching devices to operate under high power with improved intermodulation distortion, insertion loss, and/or isolation performance.

In some embodiments, an increased number of transistors can be implemented in a switch arm segment of a switching device to enable improved power handling capability of the switching device. For example, a switch arm segment can include an increased number of FETs connected in series, an increased FET stack height, to enable improved device performance under high power. However, in some embodiments, increased FET stack height can degrade the switching device insertion loss performance.

Examples of FET Structures and Fabrication Process Technologies:

A switching device can be implemented on-die, off-die, or some combination thereof. A switching device can also be fabricated using various technologies. In some embodiments, RF switching devices can be fabricated with silicon or silicon-on-insulator (SOI) technology.

As described herein, an RF switching device can be implemented using silicon-on-insulator (SOI) technology. In some embodiments, SOI technology can include a semiconductor substrate having an embedded layer of electrically insulating material, such as a buried oxide layer beneath a silicon device layer. For example, an SOI substrate can include an oxide layer embedded below a silicon layer. Other insulating materials known in the art can also be used.

Implementation of RF applications, such as an RF switching device, using SOI technology can improve switching device performance. In some embodiments, SOI technology can enable reduced power consumption. Reduced power consumption can be desirable in RF applications, including those associated with wireless communication devices. SOI technology can enable reduced power consumption of device circuitry due to decreased parasitic capacitance of transistors and interconnect metallization to a silicon substrate. Presence of a buried oxide layer can also reduce junction capacitance or use of high resistivity substrate, enabling reduced substrate related RF losses. Electrically isolated SOI transistors can facilitate stacking, contributing to decreased chip size.

Figure 21A:
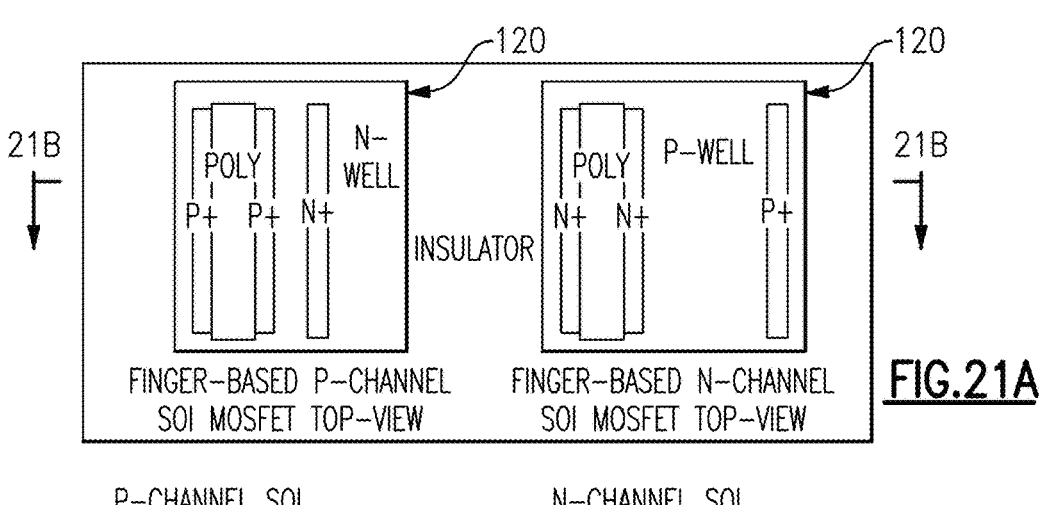
FIGS. 21A and 21B show plan and side sectional views of an example finger-based FET device implemented on silicon-on-insulator (SOI).
Figure 21B:
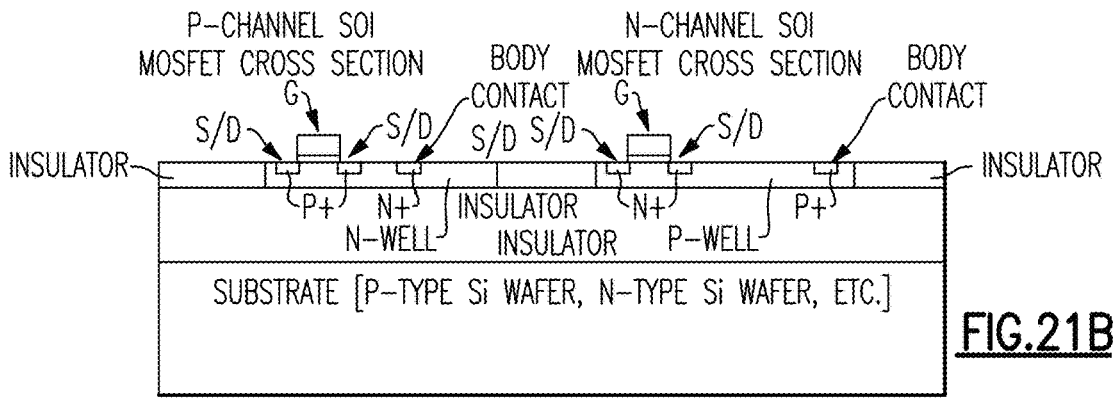

In some SOI FET configurations, each transistor can be configured as a finger-based device where the source and drain are rectangular shaped (in a plan view) and a gate structure extends between the source and drain like a rectangular shaped finger. FIGS. 21A and 21B show plan and side sectional views of an example finger-based FET device implemented on SOI. As shown, FET devices described herein can include a p-type FET or an n-type FET. Thus, although some FET devices are described herein as p-type devices, it will be understood that various concepts associated with such p-type devices can also apply to n-type devices.

As shown in FIGS. 21A and 21B, a pMOSFET can include an insulator layer formed on a semiconductor substrate. The insulator layer can be formed from materials such as silicon dioxide or sapphire. An n-well is shown to be formed in the insulator such that the exposed surface generally defines a rectangular region. Source(S) and drain (D) are shown to be p-doped regions whose exposed surfaces generally define rectangles. As shown, S/D regions can be configured so that source and drain functionalities are reversed.

FIGS. 21A and 21B further show that a gate (G) can be formed on the n-well so as to be positioned between the source and the drain. The example gate is depicted as having a rectangular shape that extends along with the source and the drain. Also shown is an n-type body contact. Formations of the rectangular shaped well, source and drain regions, and the body contact can be achieved by a number of known techniques.

Figure 22A:
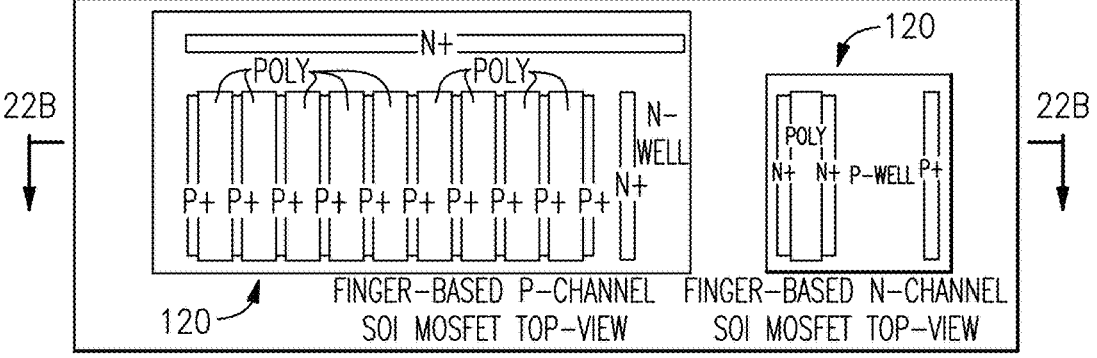
FIGS. 22A and 22B show plan and side sectional views of an example multiple-finger FET device implemented on SOI.
Figure 22B:
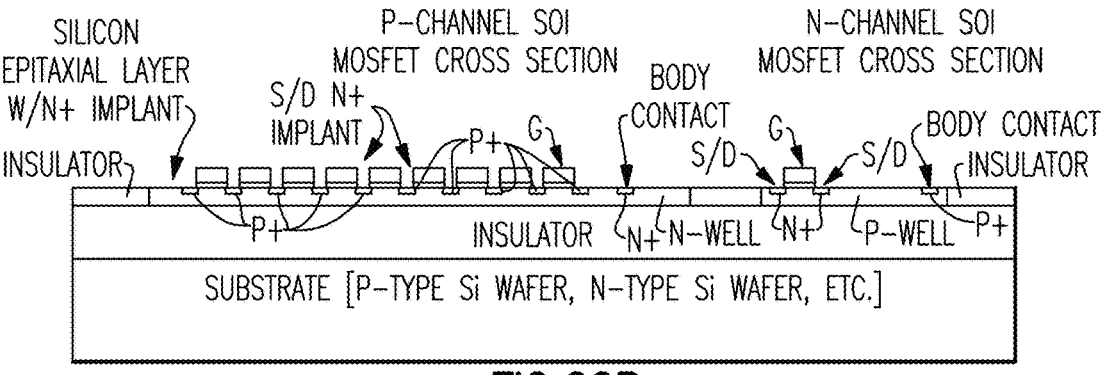

FIGS. 22A and 22B show plan and side sectional views of an example of a multiple-finger FET device implemented on SOI. Formations of rectangular shaped n-well, rectangular shaped p-doped regions, rectangular shaped gates, and n-type body contact can be achieved in manners similar to those described in reference to FIGS. 21A and 21B.

The example multiple-finger FET device of FIGS. 22A and 22B can be configured so that the source regions are electrically connected together to a source node, and the drain regions are connected together to a drain node. The gates can also be connected together to a gate node. In such an example configuration, a common gate bias signal can be provided through the gate node to control flow of current between the source node and the drain node.

In some implementations, a plurality of the foregoing multi-finger FET devices can be connected in series as a switch to allow handling of high power RF signals. Each FET device can divide the overall voltage drop associated with power dissipation at the connected FETs. A number of such multi-finger FET devices can be selected based on, for example, power handling requirement of the switch.

Examples of Implementations in Products:

Various examples of FET-based switch circuits described herein can be implemented in a number of different ways and at different product levels. Some of such product implementations are described by way of examples.

Semiconductor Die Implementation

Figure 23A:
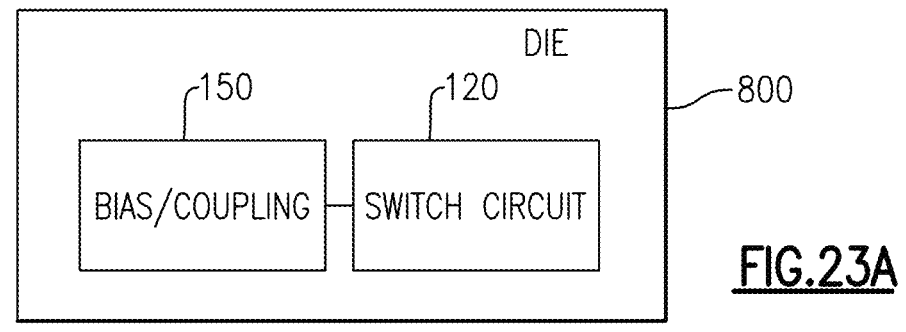
FIGS. 23A-23D show non-limiting examples of how one or more features of the present disclosure can be implemented on one or more semiconductor die.
Figure 23B:
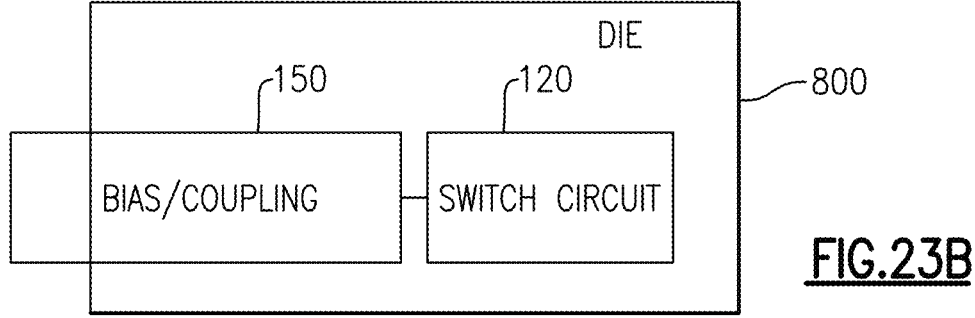

FIGS. 23A-23D show non-limiting examples of such implementations on one or more semiconductor die. FIG. 23A shows that in some embodiments, a switch circuit 120 and a bias/coupling circuit 150 having one or more features as described herein can be implemented on a die 800. FIG. 23B shows that in some embodiments, at least some of the bias/coupling circuit 150 can be implemented outside of the die 800 of FIG. 23A.

Figure 23C:
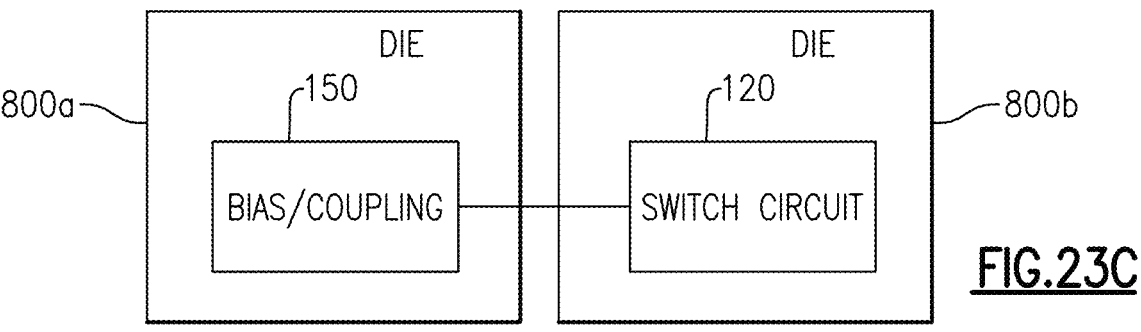
Figure 23D:
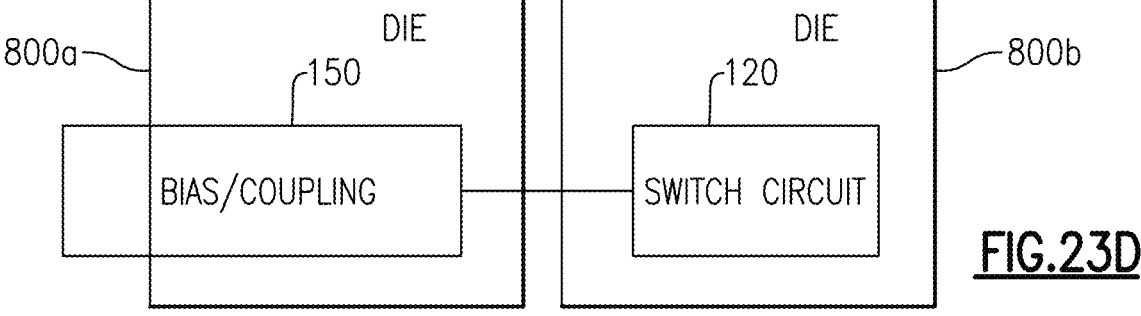

FIG. 23C shows that in some embodiments, a switch circuit 120 having one or more features as described herein can be implemented on a first die 800a, and a bias/coupling circuit 150 having one or more features as described herein can be implemented on a second die 800b. FIG. 23D shows that in some embodiments, at least some of the bias/coupling circuit 150 can be implemented outside of the first die 800a of FIG. 23C.

Packaged Module Implementation

Figure 24A:
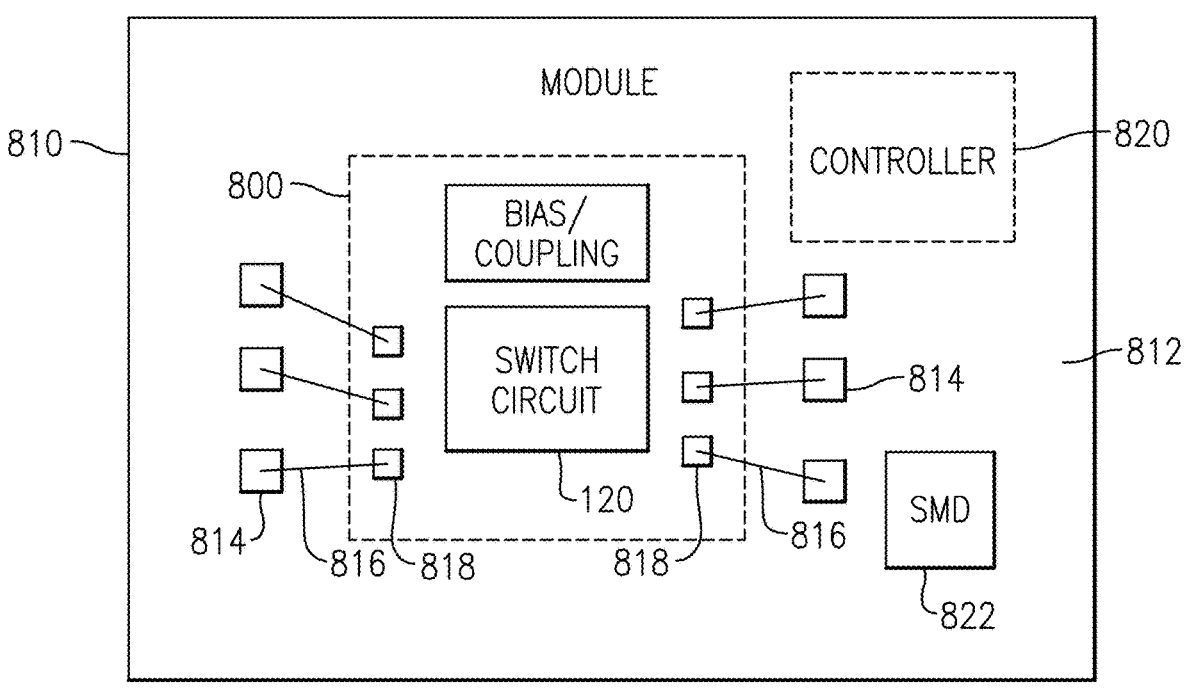
FIGS. 24A and 24B show that one or more die having one or more features described herein can be implemented in a packaged module.

In some embodiments, one or more die having one or more features described herein can be implemented in a packaged module. An example of such a module is shown in FIGS. 24A (plan view) and 24B (side view). Although described in the context of both of the switch circuit and the bias/coupling circuit being on the same die (e.g., example configuration of FIG. 23A), it will be understood that packaged modules can be based on other configurations.

A module 810 is shown to include a packaging substrate 812. Such a packaging substrate can be configured to receive a plurality of components, and can include, for example, a laminate substrate. The components mounted on the packaging substrate 812 can include one or more dies. In the example shown, a die 800 having a switching circuit 120 and a bias/coupling circuit 150 is shown to be mounted on the packaging substrate 812. The die 800 can be electrically connected to other parts of the module (and with each other where more than one die is utilized) through connections such as connection-wirebonds 816. Such connection-wirebonds can be formed between contact pads 818 formed on the die 800 and contact pads 814 formed on the packaging substrate 812. In some embodiments, one or more surface mounted devices (SMDs) 822 can be mounted on the packaging substrate 812 to facilitate various functionalities of the module 810.

In some embodiments, the packaging substrate 812 can include electrical connection paths for interconnecting the various components with each other and/or with contact pads for external connections. For example, a connection path 832 is depicted as interconnecting the example SMD 822 and the die 800. In another example, a connection path 832 is depicted as interconnecting the SMD 822 with an external-connection contact pad 834. In yet another example a connection path 832 is depicted as interconnecting the die 800 with ground-connection contact pads 836.

In some embodiments, a space above the packaging substrate 812 and the various components mounted thereon can be filled with an overmold structure 830. Such an overmold structure can provide a number of desirable functionalities, including protection for the components and wirebonds from external elements, and easier handling of the packaged module 810.

Figure 24B:
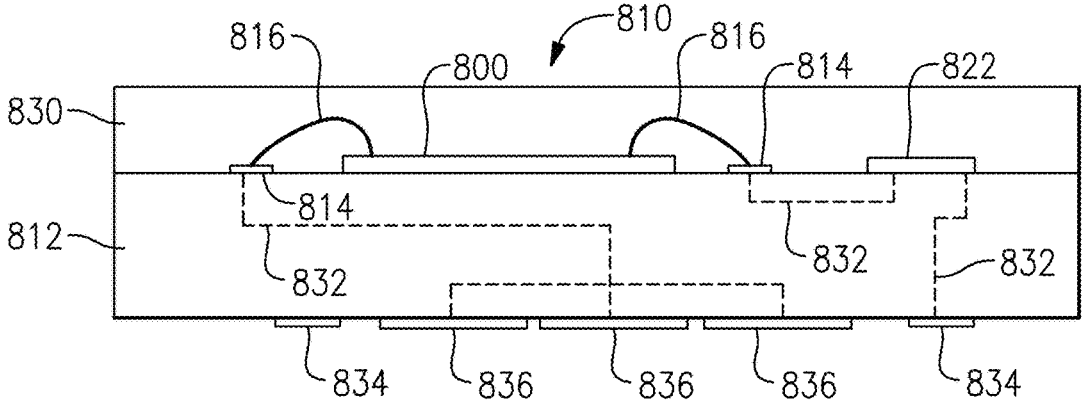
Figure 25:
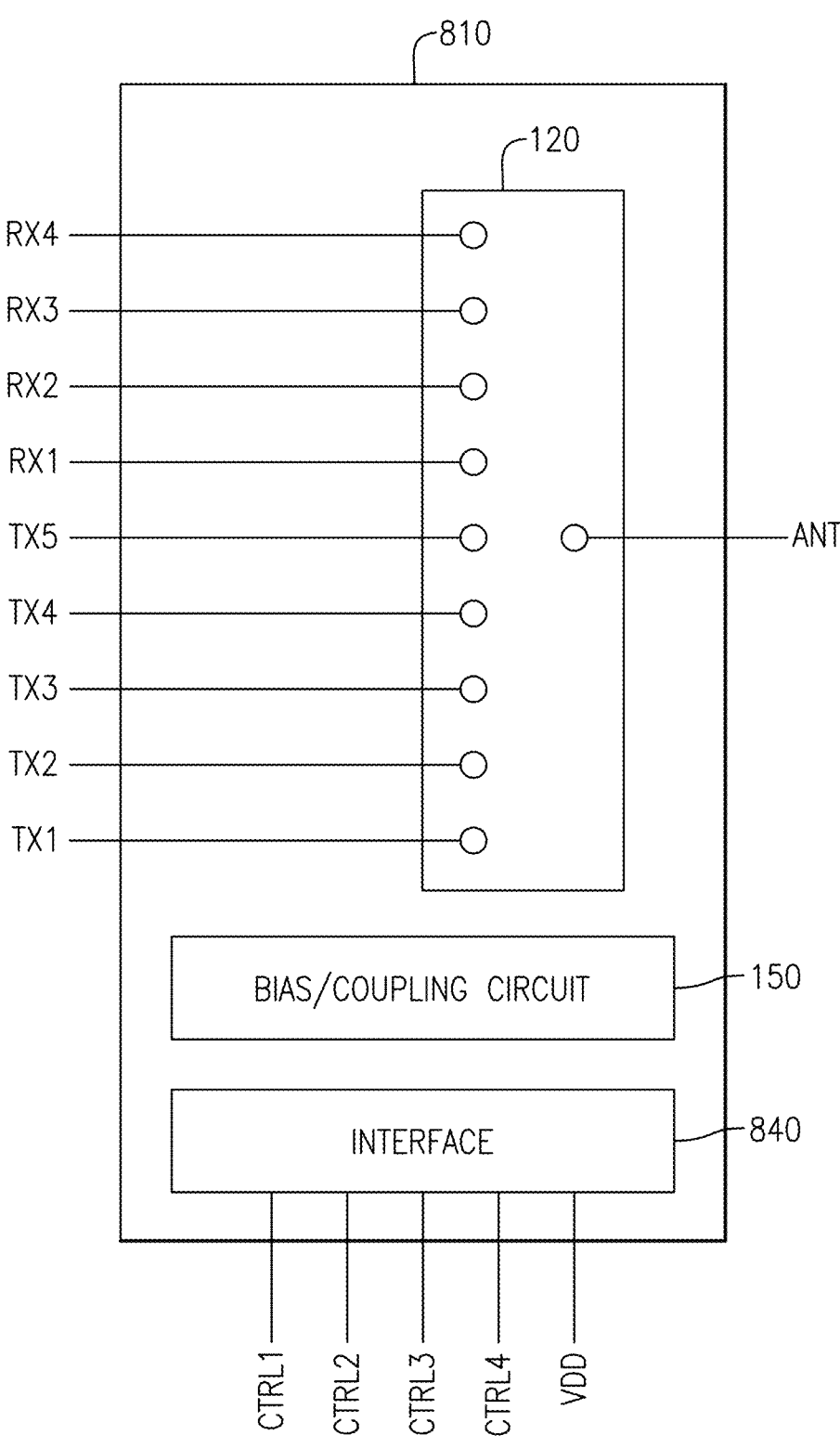
FIG. 25 shows a schematic diagram of an example switching configuration that can be implemented in a module such as the example of FIGS. 24A and 24B.

FIG. 25 shows a schematic diagram of an example switching configuration that can be implemented in the module 810 described in reference to FIGS. 24A and 24B. In the example, the switch circuit 120 is depicted as being an SP9T switch, with the pole being connectable to an antenna and the throws being connectable to various Rx and Tx paths. Such a configuration can facilitate, for example, multi-mode multi-band operations in wireless devices.

The module 810 can further include an interface for receiving power (e.g., supply voltage VDD) and control signals to facilitate operation of the switch circuit 120 and/or the bias/coupling circuit 150. In some implementations, supply voltage and control signals can be applied to the switch circuit 120 via the bias/coupling circuit 150.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

FIG. 26 schematically depicts an example wireless device 900 having one or more advantageous features described herein. In the context of various switches and various biasing/coupling configurations as described herein, a switch 120 and a bias/coupling circuit 150 can be part of a module 810. In some embodiments, such a switch module can facilitate, for example, multi-band multi-mode operation of the wireless device 900.

In the example wireless device 900, a power amplifier (PA) module 916 having a plurality of PAs can provide an amplified RF signal to the switch 120 (via a duplexer 920), and the switch 120 can route the amplified RF signal to an antenna. The PA module 916 can receive an unamplified RF signal from a transceiver 914 that can be configured and operated in known manners. The transceiver can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system 910 and the module 810.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexer 920 can allow transmit and receive operations to be performed simultaneously using a common antenna (e.g., 924). In FIG. 26, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for implementing a radio-frequency switching device, the method comprising:
determining an electrical parameter of a first plurality of field-effect transistors for forming a first stack, the first plurality of field-effect transistors having a uniform distribution of a physical parameter of the first plurality of field-effect transistors across the first stack, the electrical parameter of the first plurality of field-effect transistors having a non-uniform distribution across the first stack corresponding to the uniform distribution of the physical parameter across the first stack;
determining a non-uniform distribution of the physical parameter for a second plurality of field-effect transistors for forming a second stack, the non-uniform distribution of the physical parameter of the second stack based on the non-uniform distribution of the electrical parameter of the first plurality of field-effect transistors across the first stack;
providing a semiconductor substrate;
forming the second plurality of field-effect transistors on the semiconductor substrate such that the second plurality of field-effect transistors has the non-uniform distribution of the physical parameter; and
connecting the second plurality of field-effect transistors to form the second stack such that the non-uniform distribution of the physical parameter across the second stack results in the second stack having a second voltage handling capacity that is greater than a first voltage handling capacity corresponding to the first stack having the uniform distribution of the physical parameter of the first plurality of field-effect transistors across the first stack.

2. The method of claim 1 wherein the second stack further has a second ON-resistance (Ron) value that is less than a first Ron value corresponding to the first stack having the uniform distribution of the physical parameter.

3. The method of claim 1 wherein the second stack further has a second linearity performance that is better than a first linearity performance corresponding to the first stack having the uniform distribution of the physical parameter.

4. The method of claim 1 wherein each of the second plurality of field-effect transistors has a source, a drain, and a gate formed on an active region.

5. The method of claim 4 wherein a field-effect transistor is implemented as a silicon-on-insulator (SOI) device.

6. The method of claim 4 wherein the physical parameter includes a gate length.

7. The method of claim 6 wherein a field-effect transistor is implemented as a finger configuration device such that the gate includes a number of rectangular shaped gate fingers, each gate finger implemented between a rectangular shaped source finger of a source contact and a rectangular shaped drain finger of a drain contact.

8. The method of claim 6 wherein the non-uniform distribution of the gate length is based on a non-uniform distribution of an electrical parameter associated with the first plurality of field-effect transistors.

9. The method of claim 8 wherein the electrical parameter includes a distribution of voltage VDS across each field-effect transistor.

10. The method of claim 9 wherein the non-uniform distribution of the gate length tracks a scaled version of the voltage VDS distribution.

11. The method of claim 10 wherein the scaled version of the voltage VDS distribution is based on scaling of a highest value of a voltage VDS distribution corresponding to the uniform distribution of the gate length.

12. The method of claim 11 wherein the highest value of the voltage VDS is for a first field-effect transistor from a first terminal of the second stack.

13. The method of claim 12 wherein the first terminal is configured as an input terminal for receiving a radio-frequency signal.

14. The method of claim 12 wherein the gate length of at least the first field-effect transistor is greater than a value of the uniform distribution of the gate length.

15. The method of claim 14 wherein at least some of the second plurality of field-effect transistors have gate lengths that are less than the value of the uniform distribution of the gate length.

16. The method of claim 12 wherein a sum of VDS values of the second plurality of field-effect transistors for the non-uniform distribution of the gate length is greater than a sum of VDS values of the first plurality of field-effect transistors for the uniform distribution of the gate length.

17. The method of claim 16 wherein a sum of gate lengths of the second plurality of field-effect transistors for the non-uniform distribution of the gate length is greater than a sum of the gate length of the first plurality of field-effect transistors for the uniform distribution of the gate length.

18. The method of claim 8 wherein the non-uniform distribution of the gate length includes a plurality of groups of gate length values, each group having a common value of the gate length.

\* \* \* \* \*